(12) United States Patent
Gordon et al.

(10) Patent No.: US 8,481,385 B2
(45) Date of Patent: Jul. 9, 2013

(54) METHODS OF FABRICATING A MEMORY DEVICE

(75) Inventors: Haller A. Gordon, Boise, ID (US); Tang D. Sanh, Boise, ID (US); Cummings Steven, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/469,513

(22) Filed: May 11, 2012

(65) Prior Publication Data

US 2012/0231592 A1 Sep. 13, 2012

Related U.S. Application Data

(63) Continuation of application No. 12/703,502, filed on Feb. 10, 2010, now Pat. No. 8,222,105, which is a continuation of application No. 11/218,184, filed on Aug. 31, 2005, now Pat. No. 7,696,567.

(51) Int. Cl.
*H01L 29/94* (2006.01)

(52) U.S. Cl.
USPC ............ 438/253; 438/242; 438/288; 438/292

(58) Field of Classification Search
USPC ........... 438/242, 288, 972, 253; 257/E21.646
See application file for complete search history.

(56) References Cited

U.S. PATENT DOCUMENTS

| | | | |
|---|---|---|---|
| 3,731,287 A | 5/1973 | Seely et al. |
| 3,732,287 A | 5/1973 | Himmele et al. |
| 3,941,629 A | 3/1976 | Jaffe |
| 4,139,442 A | 2/1979 | Bondour et al. |
| 4,234,362 A | 11/1980 | Riseman |
| 4,333,964 A | 6/1982 | Ghezzo |
| 4,419,809 A | 12/1983 | Riseman et al. |
| 4,432,132 A | 2/1984 | Kinsbron et al. |
| 4,470,062 A | 9/1984 | Muramatsu |
| 4,472,459 A | 9/1984 | Fisher |
| 4,502,914 A | 3/1985 | Trumpp et al. |
| 4,508,757 A | 4/1985 | Fabricius et al. |

(Continued)

FOREIGN PATENT DOCUMENTS

| | | |
|---|---|---|
| DE | 0227303 | 7/1987 |
| DE | 280851 | 7/1990 |

(Continued)

OTHER PUBLICATIONS

Cho et al., "A novel pillar DRAM cell for 4Gbit and beyond," Digest of Technical Papers Symposium on VLSI Technology, Jun. 1998, pp. 38-39.

(Continued)

*Primary Examiner* — Douglas M Menz
*Assistant Examiner* — Neil Prasad
(74) *Attorney, Agent, or Firm* — Wells St. John, P.S.

(57) ABSTRACT

A memory device comprising a vertical transistor includes a digit line that is directly coupled to the source regions of each memory cell. Because an electrical plug is not used to form a contact between the digit line and the source regions, a number of fabrication steps may be reduced and the possibility for manufacturing defects may also be reduced. In some embodiments, a memory device may include a vertical transistor having gate regions that are recessed from an upper portion of a silicon substrate. With the gate regions recessed from the silicon substrate, the gate regions are spaced further from the source/drain regions and, accordingly, cross capacitance between the gate regions and the source/drain regions may be reduced.

12 Claims, 26 Drawing Sheets

U.S. PATENT DOCUMENTS

| | | |
|---|---|---|
| 4,551,910 A | 11/1985 | Patterson |
| 4,570,325 A | 2/1986 | Higuchi |
| 4,615,762 A | 10/1986 | Jastrzebski et al. |
| 4,630,356 A | 12/1986 | Christie et al. |
| 4,648,937 A | 3/1987 | Ogura et al. |
| 4,716,131 A | 12/1987 | Okazawa et al. |
| 4,746,630 A | 5/1988 | Hui et al. |
| 4,776,922 A | 10/1988 | Bhattacharyya et al. |
| 4,789,560 A | 12/1988 | Yen |
| 4,838,991 A | 6/1989 | Cote et al. |
| 4,903,344 A | 2/1990 | Inoue |
| 4,959,325 A | 9/1990 | Lee et al. |
| 4,965,221 A | 10/1990 | Dennison et al. |
| 4,983,544 A | 1/1991 | Lu et al. |
| 5,013,680 A | 5/1991 | Lowrey et al. |
| 5,041,898 A | 8/1991 | Urabe et al. |
| 5,047,117 A | 9/1991 | Roberts |
| 5,053,105 A | 10/1991 | Fox, III |
| 5,057,449 A | 10/1991 | Lowrey et al. |
| 5,087,586 A | 2/1992 | Chan et al. |
| 5,117,027 A | 5/1992 | Bernhardt et al. |
| 5,122,848 A | 6/1992 | Lee et al. |
| 5,128,274 A | 7/1992 | Yabu et al. |
| 5,149,669 A | 9/1992 | Hosaka |
| 5,177,027 A | 1/1993 | Lowrey et al. |
| 5,210,046 A | 5/1993 | Crotti |
| 5,250,450 A | 10/1993 | Lee et al. |
| 5,252,504 A | 10/1993 | Lowrey et al. |
| 5,260,229 A | 11/1993 | Hodges et al. |
| 5,295,092 A | 3/1994 | Hotta |
| 5,305,252 A | 4/1994 | Saeki |
| 5,316,966 A | 5/1994 | Van Der Plas et al. |
| 5,319,753 A | 6/1994 | MacKenna et al. |
| 5,328,810 A | 7/1994 | Lowrey et al. |
| 5,330,879 A | 7/1994 | Dennison |
| 5,334,548 A | 8/1994 | Shen et al. |
| 5,358,894 A | 10/1994 | Fazan et al. |
| 5,409,563 A | 4/1995 | Cathey |
| 5,414,287 A | 5/1995 | Hong |
| 5,416,350 A | 5/1995 | Watanabe |
| 5,438,016 A | 8/1995 | Figura et al. |
| 5,457,067 A | 10/1995 | Han |
| 5,458,999 A | 10/1995 | Szabo et al. |
| 5,466,632 A | 11/1995 | Lur et al. |
| 5,468,675 A | 11/1995 | Kaigawa |
| 5,497,017 A | 3/1996 | Gonzales |
| 5,502,320 A | 3/1996 | Yamada |
| 5,514,885 A | 5/1996 | Myrick |
| 5,539,229 A | 7/1996 | Noble et al. |
| 5,563,012 A | 10/1996 | Neisser |
| 5,569,620 A | 10/1996 | Linn et al. |
| 5,583,065 A | 12/1996 | Miwa |
| 5,596,759 A | 1/1997 | Miller et al. |
| 5,604,159 A | 2/1997 | Cooper et al. |
| 5,607,874 A | 3/1997 | Wang et al. |
| 5,638,318 A | 6/1997 | Seyyedy |
| 5,670,794 A | 9/1997 | Manning |
| 5,675,164 A | 10/1997 | Brunner et al. |
| 5,677,865 A | 10/1997 | Seyyedy |
| 5,679,591 A | 10/1997 | Lin et al. |
| 5,680,344 A | 10/1997 | Seyyedy |
| 5,700,733 A | 12/1997 | Manning |
| 5,705,321 A | 1/1998 | Brueck et al. |
| 5,747,377 A | 5/1998 | Wu |
| 5,748,519 A | 5/1998 | Tehrani et al. |
| 5,753,546 A | 5/1998 | Koh et al. |
| 5,756,395 A | 5/1998 | Rostoker et al. |
| 5,780,349 A | 7/1998 | Naem |
| 5,789,269 A | 8/1998 | Mehta et al. |
| 5,789,306 A | 8/1998 | Roberts et al. |
| 5,789,320 A | 8/1998 | Andricacos et al. |
| 5,795,830 A | 8/1998 | Cronin et al. |
| 5,804,458 A | 9/1998 | Tehrani et al. |
| 5,821,600 A | 10/1998 | Chan |
| 5,834,359 A | 11/1998 | Jeng et al. |
| 5,841,611 A | 11/1998 | Sakakima et al. |
| 5,861,328 A | 1/1999 | Tehrani et al. |
| 5,864,496 A | 1/1999 | Mueller et al. |
| 5,892,708 A | 4/1999 | Pohm |
| 5,895,238 A | 4/1999 | Mitani |
| 5,895,273 A | 4/1999 | Burns et al. |
| 5,899,727 A | 5/1999 | Hause et al. |
| 5,902,690 A | 5/1999 | Tracy et al. |
| 5,905,285 A | 5/1999 | Gardner et al. |
| 5,907,170 A | 5/1999 | Forbes et al. |
| 5,909,618 A | 6/1999 | Forbes et al. |
| 5,909,630 A | 6/1999 | Roberts et al. |
| 5,917,745 A | 6/1999 | Fujii |
| 5,917,749 A | 6/1999 | Chen et al. |
| 5,956,267 A | 9/1999 | Hurst et al. |
| 5,963,469 A | 10/1999 | Forbes |
| 5,963,803 A | 10/1999 | Dawson et al. |
| 5,977,579 A | 11/1999 | Nobles |
| 5,998,256 A | 12/1999 | Juengling |
| 6,004,862 A | 12/1999 | Kim et al. |
| 6,005,798 A | 12/1999 | Sakakima et al. |
| 6,005,800 A | 12/1999 | Koch et al. |
| 6,008,106 A | 12/1999 | Tu et al. |
| 6,010,946 A | 1/2000 | Hisamune et al. |
| 6,042,998 A | 3/2000 | Brueck et al. |
| 6,049,106 A | 4/2000 | Forbes |
| 6,057,573 A | 5/2000 | Kirsch et al. |
| 6,063,688 A | 5/2000 | Doyle et al. |
| 6,066,191 A | 5/2000 | Tanaka et al. |
| 6,066,869 A | 5/2000 | Noble et al. |
| 6,071,789 A | 6/2000 | Yang et al. |
| 6,072,209 A | 6/2000 | Noble et al. |
| 6,077,745 A | 6/2000 | Burns et al. |
| 6,097,065 A | 8/2000 | Forbes et al. |
| 6,104,068 A | 8/2000 | Forbes |
| 6,104,633 A | 8/2000 | Abraham et al. |
| 6,111,782 A | 8/2000 | Sakakima et al. |
| 6,121,148 A | 9/2000 | Bashir et al. |
| 6,134,139 A | 10/2000 | Bhattacharyya et al. |
| 6,141,204 A | 10/2000 | Schuegraf et al. |
| 6,147,405 A | 11/2000 | Hu |
| 6,150,211 A | 11/2000 | Zahurak |
| 6,150,687 A | 11/2000 | Noble et al. |
| 6,150,688 A | 11/2000 | Maeda et al. |
| 6,157,064 A | 12/2000 | Huang |
| 6,165,833 A | 12/2000 | Parekh et al. |
| 6,172,391 B1 | 1/2001 | Goebel et al. |
| 6,174,780 B1 | 1/2001 | Robinson |
| 6,175,146 B1 | 1/2001 | Lane et al. |
| 6,191,470 B1 | 2/2001 | Forbes et al. |
| 6,211,044 B1 | 4/2001 | Xiang et al. |
| 6,229,169 B1 | 5/2001 | Hofmann et al. |
| 6,236,590 B1 | 5/2001 | Bhattacharyya et al. |
| 6,238,976 B1 | 5/2001 | Noble et al. |
| 6,246,083 B1 | 6/2001 | Noble |
| 6,265,742 B1 | 7/2001 | Gruening et al. |
| 6,271,080 B1 | 8/2001 | Mandelman et al. |
| 6,274,905 B1 | 8/2001 | Mo |
| 6,282,113 B1 | 8/2001 | Debrosse |
| 6,288,454 B1 | 9/2001 | Allman |
| 6,291,334 B1 | 9/2001 | Somekh |
| 6,297,554 B1 | 10/2001 | Lin |
| 6,306,727 B1 | 10/2001 | Akram |
| 6,316,309 B1 | 11/2001 | Holmes |
| 6,320,222 B1 | 11/2001 | Forbes et al. |
| 6,348,380 B1 | 2/2002 | Weimer et al. |
| 6,350,635 B1 | 2/2002 | Noble et al. |
| 6,355,961 B1 | 3/2002 | Forbes |
| 6,362,057 B1 | 3/2002 | Taylor et al. |
| 6,368,950 B1 | 4/2002 | Xiang et al. |
| 6,376,317 B1 | 4/2002 | Forbes et al. |
| 6,377,070 B1 | 4/2002 | Forbes |
| 6,383,907 B1 | 5/2002 | Hasegawa et al. |
| 6,391,782 B1 | 5/2002 | Yu |
| 6,395,613 B1 | 5/2002 | Juengling et al. |
| 6,396,096 B1 | 5/2002 | Park et al. |
| 6,399,979 B1 | 6/2002 | Noble et al. |
| 6,404,056 B1 | 6/2002 | Kuge et al. |
| 6,413,825 B1 | 7/2002 | Forbes |
| 6,414,356 B1 | 7/2002 | Forbes et al. |
| 6,423,474 B1 | 7/2002 | Holscher |
| 6,424,001 B1 | 7/2002 | Forbes et al. |

| Patent Number | Date | Inventor(s) |
|---|---|---|
| 6,424,561 B1 | 7/2002 | Li et al. |
| 6,440,801 B1 | 8/2002 | Furukawa et al. |
| 6,448,601 B1 | 9/2002 | Forbes et al. |
| 6,455,372 B1 | 9/2002 | Weimer |
| 6,458,662 B1 | 10/2002 | Yu |
| 6,459,119 B1 | 10/2002 | Huang et al. |
| 6,461,957 B1 | 10/2002 | Yokoyama et al. |
| 6,475,869 B1 | 11/2002 | Yu |
| 6,475,874 B2 | 11/2002 | Xiang et al. |
| 6,475,894 B1 | 11/2002 | Huang et al. |
| 6,492,233 B2 | 12/2002 | Forbes et al. |
| 6,496,034 B2 | 12/2002 | Forbes et al. |
| 6,498,062 B2 | 12/2002 | Duncan et al. |
| 6,504,201 B1 | 1/2003 | Noble et al. |
| 6,514,884 B2 | 2/2003 | Maeda |
| 6,522,584 B1 | 2/2003 | Chen et al. |
| 6,531,727 B2 | 3/2003 | Forbes et al. |
| 6,534,243 B1 | 3/2003 | Templeton |
| 6,537,870 B1 | 3/2003 | Shen |
| 6,545,904 B2 | 4/2003 | Tran |
| 6,548,396 B2 | 4/2003 | Naik et al. |
| 6,551,878 B2 | 4/2003 | Clampitt et al. |
| 6,559,017 B1 | 5/2003 | Brown et al. |
| 6,559,491 B2 | 5/2003 | Forbes et al. |
| 6,566,280 B1 | 5/2003 | Meagley et al. |
| 6,566,682 B2 | 5/2003 | Forbes |
| 6,573,030 B1 | 6/2003 | Fairbairn et al. |
| 6,597,203 B2 | 7/2003 | Forbes et al. |
| 6,602,779 B1 | 8/2003 | Li et al. |
| 6,617,651 B2 | 9/2003 | Ohsawa |
| 6,627,933 B2 | 9/2003 | Juengling |
| 6,632,741 B1 | 10/2003 | Clevenger et al. |
| 6,638,441 B2 | 10/2003 | Chang et al. |
| 6,639,268 B2 | 10/2003 | Forbes et al. |
| 6,641,985 B2 | 11/2003 | Unno et al. |
| 6,645,806 B2 | 11/2003 | Roberts |
| 6,646,303 B2 | 11/2003 | Satoh et al. |
| 6,664,806 B2 | 12/2003 | Forbes et al. |
| 6,667,237 B1 | 12/2003 | Metzler |
| 6,670,642 B2 | 12/2003 | Takaura et al. |
| 6,673,684 B1 | 1/2004 | Huang et al. |
| 6,677,230 B2 | 1/2004 | Yokoyama et al. |
| 6,686,245 B1 | 2/2004 | Mathew et al. |
| 6,686,274 B1 | 2/2004 | Shimazu et al. |
| 6,689,695 B1 | 2/2004 | Lui et al. |
| 6,693,026 B2 | 2/2004 | Kim et al. |
| 6,696,746 B1 | 2/2004 | Farrar et al. |
| 6,699,763 B2 | 3/2004 | Grider et al. |
| 6,706,571 B1 | 3/2004 | Yu et al. |
| 6,707,092 B2 | 3/2004 | Sasaki |
| 6,709,807 B2 | 3/2004 | Hallock et al. |
| 6,734,063 B2 | 5/2004 | Willer et al. |
| 6,734,107 B2 | 5/2004 | Lai et al. |
| 6,734,482 B1 | 5/2004 | Tran et al. |
| 6,734,484 B2 | 5/2004 | Wu |
| 6,744,094 B2 | 6/2004 | Forbes |
| 6,756,625 B2 | 6/2004 | Brown |
| 6,768,663 B2 | 7/2004 | Ogata |
| 6,773,998 B1 | 8/2004 | Fisher et al. |
| 6,777,725 B2 | 8/2004 | Willer et al. |
| 6,781,212 B1 | 8/2004 | Kao et al. |
| 6,794,699 B2 | 9/2004 | Bissey et al. |
| 6,794,710 B2 | 9/2004 | Chang et al. |
| 6,797,573 B2 | 9/2004 | Brown |
| 6,798,009 B2 | 9/2004 | Forbes et al. |
| 6,800,930 B2 | 10/2004 | Jackson et al. |
| 6,801,056 B2 | 10/2004 | Forbes |
| 6,806,137 B2 | 10/2004 | Tran et al. |
| 6,808,979 B1 | 10/2004 | Lin et al. |
| 6,811,954 B1 | 11/2004 | Fukuda |
| 6,825,129 B2 | 11/2004 | Hong |
| 6,825,529 B2 | 11/2004 | Chidambarrao et al. |
| 6,835,988 B2 | 12/2004 | Yamashita |
| 6,844,591 B1 | 1/2005 | Tran |
| 6,867,116 B1 | 3/2005 | Chung |
| 6,875,703 B1 | 4/2005 | Furukawa et al. |
| 6,881,627 B2 | 4/2005 | Forbes et al. |
| 6,882,006 B2 | 4/2005 | Maeda et al. |
| 6,890,858 B2 | 5/2005 | Juengling et al. |
| 6,893,972 B2 | 5/2005 | Rottstegge et al. |
| 6,900,521 B2 | 5/2005 | Forbes et al. |
| 6,908,800 B1 | 6/2005 | Kim et al. |
| 6,936,507 B2 | 8/2005 | Tang et al. |
| 6,946,389 B2 | 9/2005 | Farrar et al. |
| 6,946,709 B2 | 9/2005 | Yang |
| 6,955,961 B1 | 10/2005 | Chung |
| 6,960,832 B2 | 11/2005 | Shimazu |
| 6,962,867 B2 | 11/2005 | Jackson et al. |
| 6,964,895 B2 | 11/2005 | Hsu |
| 6,964,916 B2 | 11/2005 | Kuo et al. |
| 7,015,124 B1 | 3/2006 | Fisher et al. |
| 7,042,047 B2 | 5/2006 | Eppich |
| 7,049,702 B2 | 5/2006 | Tseng |
| 7,071,043 B2 | 7/2006 | Tang et al. |
| 7,091,566 B2 | 8/2006 | Zhu et al. |
| 7,098,105 B2 | 8/2006 | Juengling |
| 7,098,536 B2 | 8/2006 | Yang et al. |
| 7,105,089 B2 | 9/2006 | Fanselow et al. |
| 7,109,544 B2 | 9/2006 | Schlosser et al. |
| 7,112,483 B2 | 9/2006 | Lin et al. |
| 7,112,815 B2 | 9/2006 | Prall |
| 7,115,525 B2 | 10/2006 | Abatchev et al. |
| 7,118,960 B2 | 10/2006 | Tran |
| 7,122,425 B2 | 10/2006 | Chance et al. |
| 7,151,040 B2 | 12/2006 | Tran et al. |
| 7,151,690 B2 | 12/2006 | Forbes |
| 7,176,109 B2 | 2/2007 | Ping et al. |
| 7,183,164 B2 | 2/2007 | Haller et al. |
| 7,183,597 B2 | 2/2007 | Doyle |
| 7,208,379 B2 | 4/2007 | Venugopal et al. |
| 7,214,629 B1 | 5/2007 | Luo et al. |
| 7,238,580 B2 | 7/2007 | Orlowski et al. |
| 7,253,118 B2 | 8/2007 | Tran et al. |
| 7,262,089 B2 | 8/2007 | Abbott et al. |
| 7,268,054 B2 | 9/2007 | Tran et al. |
| 7,285,812 B2 | 10/2007 | Tang et al. |
| 7,371,627 B1 | 5/2008 | Forbes |
| 7,521,322 B2 | 4/2009 | Tang |
| 2001/0005631 A1 | 6/2001 | Kim et al. |
| 2001/0019870 A1 | 9/2001 | Noble |
| 2002/0000608 A1 | 1/2002 | Harada |
| 2002/0005590 A1 | 1/2002 | Keeth |
| 2002/0024081 A1 | 2/2002 | Gratz |
| 2002/0028541 A1 | 3/2002 | Lee et al. |
| 2002/0030214 A1 | 3/2002 | Horiguchi |
| 2002/0038886 A1 | 4/2002 | Mo |
| 2002/0042198 A1 | 4/2002 | Bjarnason et al. |
| 2002/0043690 A1 | 4/2002 | Doyle et al. |
| 2002/0045308 A1 | 4/2002 | Juengling |
| 2002/0061639 A1 | 5/2002 | Ironaga |
| 2002/0063110 A1 | 5/2002 | Cantell et al. |
| 2002/0106772 A1 | 8/2002 | Croteau et al. |
| 2002/0121673 A1 | 9/2002 | Jono et al. |
| 2002/0123216 A1 | 9/2002 | Yokoyama et al. |
| 2002/0125536 A1 | 9/2002 | Iwasa et al. |
| 2002/0127810 A1 | 9/2002 | Nakamura et al. |
| 2002/0130348 A1 | 9/2002 | Tran |
| 2002/0130686 A1 | 9/2002 | Forbes et al. |
| 2002/0135029 A1 | 9/2002 | Ping et al. |
| 2003/0001290 A1 | 1/2003 | Nitayama et al. |
| 2003/0006410 A1 | 1/2003 | Doyle |
| 2003/0008461 A1 | 1/2003 | Forbes et al. |
| 2003/0015757 A1 | 1/2003 | Ohsawa |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0077855 A1 | 4/2003 | Abbott |
| 2003/0085422 A1 | 5/2003 | Amali et al. |
| 2003/0119307 A1 | 6/2003 | Bekiaris et al. |
| 2003/0127426 A1 | 7/2003 | Chang et al. |
| 2003/0132480 A1 | 7/2003 | Chau et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0218199 A1 | 11/2003 | Forbes et al. |
| 2003/0227072 A1 | 12/2003 | Forbes et al. |
| 2003/0230234 A1 | 12/2003 | Nam et al. |
| 2003/0234414 A1 | 12/2003 | Brown |

| | | |
|---|---|---|
| 2004/0000534 A1 | 1/2004 | Lipinski |
| 2004/0002203 A1 | 1/2004 | Deshpande et al. |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0036095 A1 | 2/2004 | Brown et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0070007 A1 | 4/2004 | Zhang |
| 2004/0079456 A1 | 4/2004 | Mandigo et al. |
| 2004/0079988 A1 | 4/2004 | Harari |
| 2004/0094786 A1 | 5/2004 | Tran et al. |
| 2004/0105330 A1 | 6/2004 | Juengling |
| 2004/0106257 A1 | 6/2004 | Okamura et al. |
| 2004/0150111 A1 | 8/2004 | Shimazu et al. |
| 2004/0195613 A1 | 10/2004 | Kweon |
| 2004/0217391 A1 | 11/2004 | Forbes |
| 2004/0235255 A1 | 11/2004 | Tanaka |
| 2005/0001232 A1 | 1/2005 | Bhattacharyya |
| 2005/0017156 A1 | 1/2005 | Ehrmann et al. |
| 2005/0037584 A1 | 2/2005 | Abbott |
| 2005/0045965 A1 | 3/2005 | Lin et al. |
| 2005/0046048 A1 | 3/2005 | Yun et al. |
| 2005/0048714 A1 | 3/2005 | Noble |
| 2005/0059242 A1 | 3/2005 | Cabral et al. |
| 2005/0074949 A1 | 4/2005 | Jung et al. |
| 2005/0079721 A1 | 4/2005 | Buerger et al. |
| 2005/0145913 A1 | 7/2005 | Katsumata et al. |
| 2005/0148136 A1 | 7/2005 | Brask et al. |
| 2005/0156208 A1 | 7/2005 | Lin et al. |
| 2005/0164443 A1 | 7/2005 | Kim et al. |
| 2005/0164454 A1 | 7/2005 | Leslie |
| 2005/0184348 A1 | 8/2005 | Youn et al. |
| 2005/0186705 A1 | 8/2005 | Jackson et al. |
| 2005/0207264 A1 | 9/2005 | Hseih et al. |
| 2005/0272259 A1 | 12/2005 | Hong et al. |
| 2005/0277249 A1 | 12/2005 | Juengling |
| 2006/0011996 A1 | 1/2006 | Wu et al. |
| 2006/0017088 A1 | 1/2006 | Abbott et al. |
| 2006/0019488 A1 | 1/2006 | Liaw |
| 2006/0028859 A1 | 2/2006 | Forbes |
| 2006/0033678 A1 | 2/2006 | Lubomirsky et al. |
| 2006/0043449 A1 | 3/2006 | Tang et al. |
| 2006/0043450 A1 | 3/2006 | Tang et al. |
| 2006/0043473 A1 | 3/2006 | Eppcih |
| 2006/0046200 A1 | 3/2006 | Abatchev et al. |
| 2006/0046201 A1 | 3/2006 | Sandhu et al. |
| 2006/0046407 A1 | 3/2006 | Juengling |
| 2006/0046422 A1 | 3/2006 | Tran et al. |
| 2006/0046484 A1 | 3/2006 | Abatchev et al. |
| 2006/0073613 A1 | 4/2006 | Aggarwal et al. |
| 2006/0076090 A1 | 4/2006 | Mandigo et al. |
| 2006/0083996 A1 | 4/2006 | Kim |
| 2006/0094180 A1 | 5/2006 | Doczy et al. |
| 2006/0099793 A1 | 5/2006 | Yang et al. |
| 2006/0157795 A1 | 7/2006 | Chen et al. |
| 2006/0172540 A1 | 8/2006 | Marks et al. |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0246217 A1 | 11/2006 | Weidman et al. |
| 2006/0250593 A1 | 11/2006 | Nishii |
| 2006/0252264 A1 | 11/2006 | Kimizuka et al. |
| 2006/0258084 A1 | 11/2006 | Tang et al. |
| 2006/0261393 A1 | 11/2006 | Tang et al. |
| 2006/0263699 A1 | 11/2006 | Sandhu et al. |
| 2006/0264043 A1 | 11/2006 | Stewart et al. |
| 2006/0267075 A1 | 11/2006 | Sandhu et al. |
| 2006/0273456 A1 | 12/2006 | Sant et al. |
| 2006/0278911 A1 | 12/2006 | Eppich |
| 2006/0281266 A1 | 12/2006 | Wells |
| 2006/0286740 A1 | 12/2006 | Lin et al. |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0145450 A1 | 6/2007 | Wang et al. |
| 2007/0215960 A1 | 9/2007 | Zhu et al. |

FOREIGN PATENT DOCUMENTS

| | | |
|---|---|---|
| DE | 4236609 A1 | 5/1994 |
| DE | 4408764 | 9/1994 |
| DE | 19928781 | 7/2000 |
| EP | 0227303 A2 | 7/1987 |
| EP | 0491408 A3 | 6/1992 |
| EP | 1061592 | 6/2000 |
| EP | 1357433 A2 | 10/2003 |
| EP | 0681338 | 10/2004 |
| EP | 0936623 | 4/2005 |
| JP | 53-148389 | 2/1978 |
| JP | 60-167349 | 8/1985 |
| JP | 2-219253 | 8/1990 |
| JP | 4-130630 | 5/1992 |
| JP | 4-162528 | 6/1992 |
| JP | 05-343370 | 12/1993 |
| JP | H8-55908 | 2/1996 |
| JP | H8-55920 | 2/1996 |
| JP | 11-04077 | 2/1999 |
| WO | WO01/01489 A1 | 1/2001 |
| WO | WO 02/099864 A1 | 12/2002 |
| WO | WO 2004/003977 | 1/2004 |
| WO | WO2004/032246 | 4/2004 |
| WO | WO2004/038807 | 5/2004 |
| WO | WO2004/073044 | 8/2004 |
| WO | WO 2004/001799 A2 | 12/2004 |
| WO | WO 2005/010973 A1 | 2/2005 |
| WO | WO 2005/034215 A1 | 4/2005 |
| WO | WO2005/010973 A1 | 8/2005 |
| WO | WO2005/119741 A3 | 12/2005 |
| WO | WO 2006/026699 | 3/2006 |
| WO | WO 2006/028705 | 3/2006 |

OTHER PUBLICATIONS

Denton et al., "Fully depleted dual-gated thin-film SOI P-MOSFET's fabricated in SOI islands with an isolated buried polysilicon backgate," IEEE Electron Device Letters, vol. 17. No. 11. Nov. 1996: pp. 509-511.

Doyle et al., "High performance fully-depleted tri-gate CMOS transistors," IEEE Electron Device Letters, vol. 23, No. 4, Apr. 2003, pp. 263-265.

Doyle et al., "Tri-gate fully-depleted CMOS transistors: fabrication, design and layout," 2003 Symposium on VLSI Technology Digest of Technical Papers, Jun. 2003, pp. 133-134.

Endoh et al., "2.4F.sup.2 memory cell technology with stacked-surrounding gate transistor (S-SGT) DRAM," IEEE Transactions on Electron Devices, vol. 48, No. 8, Aug. 2001, pp. 1599-1603.

Endoh et al., "Novel ultrahigh-density flash memory with a stacked-surrounding gate transistor (S-SGT) structured cell," IEEE Transactions on Electron Devices, vol. 50, No. 4, Apr. 2003: pp. 945-951.

Goebel et al., "Fully depleted surrounding gate transistor (SGT) for 70 nm DRAM and beyond," International Electron Devices Meeting, Dec. 2002, pp. 275-278.

Huang et al., "Sub-50 nm p-channel FinFET," IEEE Transactions on Electron Devices, vol. 58, No. 5, May 2001, pp. 880-886.

Kalavade et al., "A novel sub-10nm transistor," IEEE Device Research Conference, Jun. 2000, Denver, Colorado, pp. 71-72.

Kedzierski et al., "High-performance symmetric-gate and CMOS-compatible V.sub.t asymmetric-gate FinFET devices," IEDM, 2001, paper 19.5.

Miyano et al., "Numerical analysis of a cylindrical thin-pillar transistor (CYNTHIA)," IEEE Transactions on Electron Device, vol. 39, No. 8, Aug. 1992, pp. 1876-1891.

Nitayama et al., "Multi-pillar surrounding gate transistor (M-SGT) for compact and high-speed circuits," IEEE Transactions on Electron Devices, vol. 38, No. 3, Mar. 1991, pp. 573-578.

Pohm et al., "Experimental and analytical properties of 0.2-.mu.m-wide, end-on, multilayer, giant magnetoresistance, read head sensors," Journal of Applied Physics, vol. 79, Issue 8, Apr. 1996; pp. 5889-5891.

Sunouchi et al., "A Surrounding Gate Transistor (SGT) Cell for 64/256Mbit DRAMS", IEEE, ULSI Research Center, Toshiba Corporation, Japan, 1989, pp. 2.1.1-2.1.4.

Takato et al., "High performance CMOS surrounding gate transistor (SGT) for ultra high density LSIs," IEEE Electron Devices Meeting Technical Digest, 1988, pp. 222-225.

Terauchi et al., "A surrounding gate transistor (SGT) gain cell for ultra high density DRAMS," 1993 Symposium on VLSI Technology Digest of Technical Papers, 1993, pp. 21-22.

Wong et al., "Self-aligned (top and bottom) double-gate MOSFET with a 25 nm thick silicon channel," IEEE International Electron Device Meeting, 1997, pp. 427-430.

Barth Roger: "Itrs commodity memory roadmap" Memory Technology, Design and Testing, 2003. Records of the 2003 International Workshop on Jul. 28-29, 2003, IEEE, pp. 61-63.

Notes from IEDM, part 3, http://www.thinfilmmfg.com/Noteworthy/Noteworthy01/IEDM12Dec01.htm, 2 pp. (Dec. 12, 2001).

Joubert et al., "Nanometer scale linewidth control during etching of polysilicon gates in high-density plasmas", Microelectronic Engineering 69 (2003), pp. 350-357.

Chung et al., "Nanoscale Multi-Line Patterning Using Sidewall Structure", Jpn., J. App. Phys. vol. 41 (2002) Pt. 1, No. 6B, pp. 4410-4414.

Chung et al., "Pattern multiplication method and the uniformity of nanoscale multiple lines", J. Vac. Sci. Technology, B21(4), Jul./Aug. 2003, pp. 1491-1495.

Lim et al., "Atomic Layer Deposition of Transition Metals", Nature vol. 2, Nov. 2003, pp. 749-753.

Xuan et al., "60nm planarized ultra-thin body solid phase epitaxy MOSFETs," IEEE Device Research Conference, Jun. 2000, Denver, Colorado, pp. 67-68.

Quantum confinement effects in a 3D FinFET transistor, http://www.ise.com/appex/FinFET/FinFET.html, 5 pp. (Jan. 15, 2003).

Choi et al., "Sublithographic nanofabrication technology for nanocatalysts and DNA chips," J.Vac. Sci. Technol., Nov./Dec. 2003; pp. 2951-2955.

Bergeron et al., "Resolution Enhancement Techniques for the 90nm Technology Node and Beyond", Future Fab International, Issue 15, Jul. 11, 2003, 4 pages.

Bhave et al., "Developer-soluble Gap fill materials for patterning metal trenches in Via-first Dual Damascene process", preprint of Proceedings of SPIE: Advances in Resist Technology and Processing XXI; col. 5376; 2004; 8 pp.

Oehrlein et al., "Pattern transfer into low dielectric materials by high-density plasma etching", Solid State Tech., May 2000, 8 pages.

Abhinav 08et al, An analytical temperature dependent threshold voltage model for thin film surrounded gate SOL MOSFET, Proc. of the SPIE; vol. 3975, pt. 1-2, 2000, pp. 605-608.

Cho, H. et al., High performance fully and partially depleted poly-Si surrounding gate transistors, Digest of Technical Papers (IEEE Cat. No. 99CH 36325) 1999, pp. 31-32.

Clarke, P., ISSCC: Vertical transistor structures considered, EE Times Website, http://www.eetimes.com, 3 pp. Feb. 9, 2000.

Date et al., Suppression of the floating-body effect using SiGe layers in vertical surrounding-gate MOSFETs, IEEE Trans. on Electron Devices, vol. 48, No. 12, Dec. 2001; pp. 2684-2689.

De, I. et al., Impact of gate workfunction on device performance at the 50 nm technology node, Solid-State Electronics, vol. 44, No. 6, Jun. 2000, pp. 1077-1080.

Endoh, T. et al, An accurate model of fully-depleted surrounding gate transistor (FD-SGT), IEICE Transactions on Electronics, vol. E80-C, No. 7, Jul. 1997, pp. 905-910.

Endoh et al.; An analytic steady-state current-voltage characteristic of short channel fully-depleted surrounding gate transistor (FD-SGT), IEICE Transactions on Electronics, vol F80-C No. 7. Jul. 1997; pp. 911-917.

Endoh, T. et al., Analysis of high speed operation for multi-SGT, Trans. of the Institute of Electronics, vol. J80C-I, No. 8, Aug. 1997, pp. 382-383.

Endoh, T. et al., The Analysis of the Stacked-Surrounding Gate Transistor (S-SGT) DRAM for the High Speed and Low Voltage Operation, vol. E81-C, No. 9, Sep. 1998, pp. 1491-1498.

Endoh, T. et al., The Stacked-SGT DRAM using 3D-building memory array technology, Transactions of the Institute of Electronics, vol. J81C-I, No. 5, May 1998, pp. 288-289.

Endoh et al., A high signal swing pass-transistor logic using surrounding gate transistor, In: 2000 Int'l Conf. on Simulation Semiconductor Processes and Devices; pp. 273-275.

Endoh, T., et al., Floating channel type SGT flash memory, Transactions of the Institute of Electronics, vol. J82C-I, No. 3, Mar. 1999, pp. 134-135.

Endoh, T., et al., The 1.44F2 memory cell technology with the stacked-surrounding gate transistor (S-SGT) DRAM, vol. 2, May 14-17, 2000, pp. 451-454.

Forbes, L., Dram array with surrounding gate access transistors and capacitors over global bit lines, Sep. 2004, 72 pp.

Iwai, M., et al., Buried gate type SGT flash memory, Transactions of the Institute of Electronics, vol. J86-C, No. 5, May 2003, pp. 562-564.

Kim, K., et al., Nanoscale CMOS Circuit Leakage Power Reduction by Double-Gate Device International Symposium on Low Power Electronics and Design; Aug. 9-11, 2004. http://www.islped.org.

Kranti, A. et al., Optimisation for improved short-channel performance of surrounding/cylindrical gate MOSFETs, Electronics Letter, vol. 37, Issue 8, Apr. 12, 2001, pp. 533-553.

Lau et al. High aspect ratio sub-micron silicon pillars for light emission studies and photonic band gap material application; Research Journal;Jun. 1996; 3 pp.

Lau et al., High aspect ratio submicron silicon pillars fabricated by photoassisted electrochemical etching and oxidation, Applied Physics Letters, vol. 67(13), pp. 1877-1879.

Lutze et al., Field oxide thinning in poly buffer LOCOS isolation with jActive area spacings to 0.1 um, Journal of Electrochemical Society, vol. 137, No. 6; Jun. 1990;pp. 1867-1870.

Mandelman et al., Challenges and future directions for the scaling of dynamic random-access memory (DRAM), IBM J. Res. & Dev., vol. 46, No. 2/3; Mar. 5, 1992; pp. 187-212.

Matsuoka, F. et al., A study of soft error in SGT DRAM, Record of Electrical and Communication Engineering Conversazione, vol. 71, No. 1, Oct. 2002, pp. 469-470.

Matsuoka et al., Numerical analysis of alpha-particle-induced soft errors in floating channel type surrounding gate transistor (FC-SGT) DRAM cell, Electron Devices, IEEE; vol. 50 Issue 7: Jul. 2003. pp. 1638-1644.

Miyamoto et al., Effect of LDD structure and channel poly-Si thinning on a gate-all-around TFT (GAT) for SRAM's, IEEE Transactions on Electron Devices, vol. 46, No. 8, Aug. 1999; pp. 1693-1698.

Nakamura, T., A study of steady-state characteristics of SGT type three-dimensional MOS transistor, Record of Electrical and Communication Engineering Conversazione, vol. 66, No. 1. Jan. 1998: pp. 211-212.

Nishi et al., Analysis of the Shape of Diffusion Layer of Sgt for Suppressing Substrate Bias Effect, Transactions of the Institute of Electronics, vol. J84-C, No. 10, Oct. 2001; pp. 1018-1020.

Nishi, R., et al., Concave Source SGT for suppressing punch-through effect, Transactions of the Institute of Electronics, vol. J86-C, No. 2, Feb. 2003, pp. 200-201.

Nitayama, et al., High speed and compact CMOS circuits with multi-pillar surrounding gate transistors, IEEE Transactions on Electron Devices, vol. 36, No. 11, pt. 1, Nov. 1989; pp. 2605-2606.

Peters, L., Choices and Challenges for Shallow Trench Isolation, Apr. 1, 1999, Semiconductor International, www.reed-electronics.com/semiconductor.

Peters, L., Emerging Transistor Structures, Mar. 1, 2002, Semiconductor International, www.reed-electronics.com/semiconductor.

Sakai et al., A study of stacked-SGT-based pass-transistor logic circuit, Record of Electrical and Communication Engineering Conversazione, vol. 72, No. 2, Feb. 2004, pp. 108-109.

Sakamoto, W. et al., A study of current drivability of SGT, Record of Electrical and Communication Engineering Conversazione, vol. 72, No. 2, Feb. 2004, pp. 110-111.

Seeger et al., Fabrication of ordered arrays of silicon nanopillars, J. Phys. D: Appl. Phys., vol. 32, pp. L129-L132 (1999).

Suzuki et al., The 2.4F/sup 2/memory cell technology with Stacked-Surrounding Gate Transistor (S-SGT) DRAM, Trans. of the Institute of Electronics, vol. J83-C, No. 1, Jan. 2000 pp. 92-93.

Takato, H. et al., Impact of surrounding gate transistor (SGT) for ultra-high density LSI's, Electron Devices, IEEE Transactions on, vol. 38, Issue 3, Mar. 1991, pp. 573-578.

Watanabe et al., A novel circuit technology with surrounding gate transistors (SGT's) for ultra high density DRAM's, Solid-State Circuit, Journal of IEEE, vol. 30, Issue 9; Sep. 1995: pp. 960-971.

Wolf et al., Silicon processing for the VLSI era, vol. 1, Lattice Press, pp. 529-555 (1986).

Yamashita, H. et al., A study of process design in three dimensional SGT device, Record of Electrical and Communication Engineering Conversazione, vol. 71, No. 1, Oct. 2002, pp. 467-468.

Zhang, W. et al., A study of load capacitance in SGT, Record of Electrical and Communication Engineering Conversazione, vol. 71, No. 1, Oct. 2002, pp. 473-474.

Chen I. C. et al., A Trench Isolation Study for Deep Submicron CMOS Technology VLSI Technology, Systems, and Applications, 1993. May 12-14, 1993, pp. 251-255.

Choi Y-K et al, Nanoscale CMOS Spacer FinFET for the Terabit Era IEEE Electron Device Letters, IEEE Inc.

Cristoloveanu S: Introduction to Silicon on Insulator Materials and Devices Microelectronic Engineering, Elsevier Publishers BV., vol. 39, No. 1-4, Dec. 1, 1997, pp. 145-154.

Gili, Enrico, Fabrication of Vertical Mos Transistors at Southampton University, Progress Report, Jul. 2003.

Hisamoto D. et al., FinFET-A Self-Aligned Double-Gate Mosfet Scaleable to 20 NM IEEE Transactions on Electron Devices, IEEE Inc, vol. 47, No. 12, Dec. 2000 pp. 2320-2325.

Imai K et al: Crystalline Quality of Silicon Layer Formed by Fipos Technology Journal of Crystal Growth, North-Holland Publishing Co., vol. 63, 1983, pp. 547-553.

Kal S., Isolation Technology in Monolithic Integrated Circuits: an overview IETE Technical Review, vol. 11, No. 2-3, Mar. 1994, pp. 91-103.

Sakao et al., A Straight-Line-Trench Isolation and Trench-Gate Transistor (SLIT) Cell for Giga-bit DRAMs, 3A-2, pp. 19-20, ULSI Device Development Laboratories, NEC Corporatio.

Scholesser et al., Highly Scalable Sub-50nm Vertical Gate Trenh Dram Cell, Memory Development Center, Infineon Tech., 2004, 4 pp.

Takeda, Eiji et al. A New Soi Device-Delta-Structure and Characteristics IEICE Transactions, Institute of Electronics Information and Comm. Eng., vol. E74, No. 2, Feb. 1, 1991; pp. 360-368.

Yan, Ran-Hong, et al., Scaling the Si MOSFET: From Bulk to SOI to Bulk; IEEE Transactions on Electron Devices, vol. 39 No. 7 Jul. 1992, pp. 1704-1710.

Hioki, M., et al "An analysis of program and erase operation for FC-SGT flash memory cells," In: 2000 International Conference on Simulation Semiconductor Processes and Devices (Cat. No. 00TH8502); IEEE; 2000; pp. 116-118.

Terauchi, M. et al., "Depletion isolation effect of surrounding gate transistors," IEEE Transactions on, vol. 44, Issue 12, Dec. 1997, pp. 2303-2305.

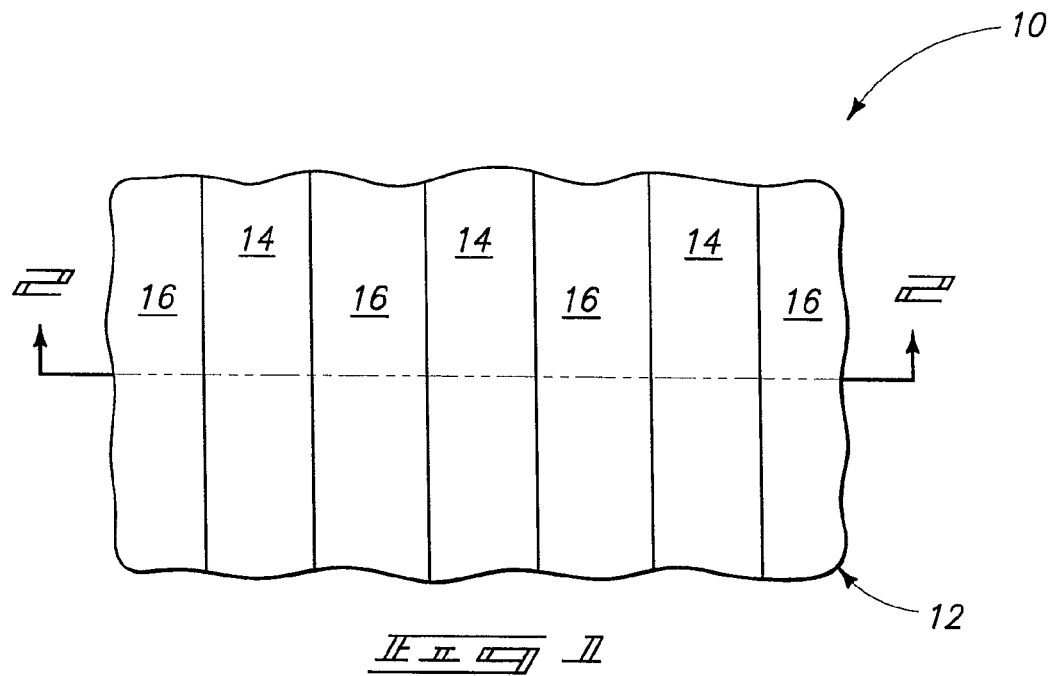
_F I G. 1_
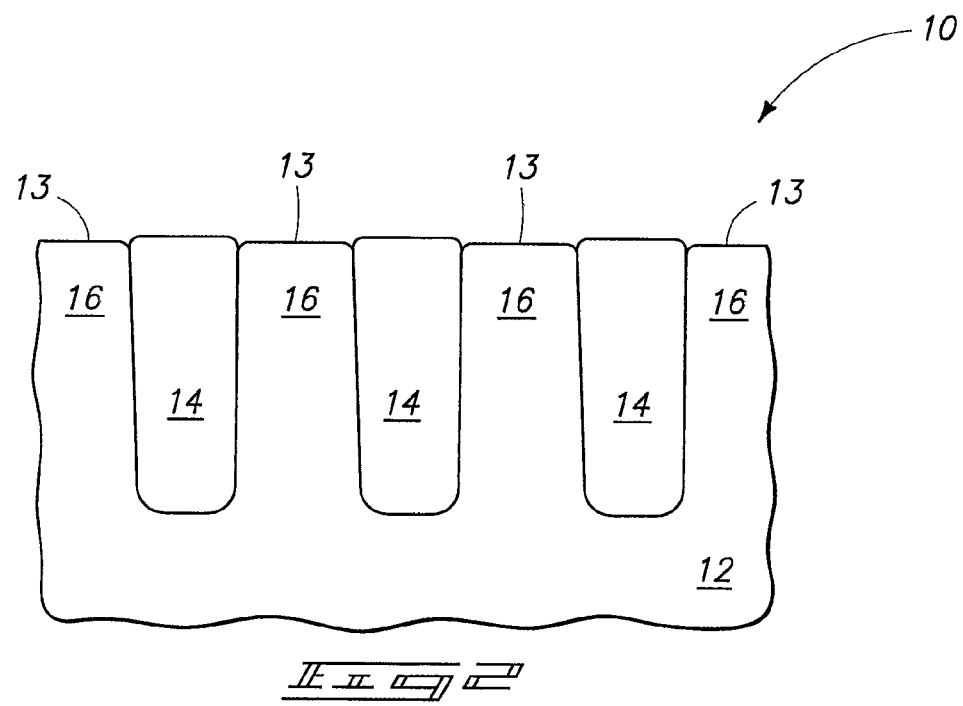
_F I G. 2_

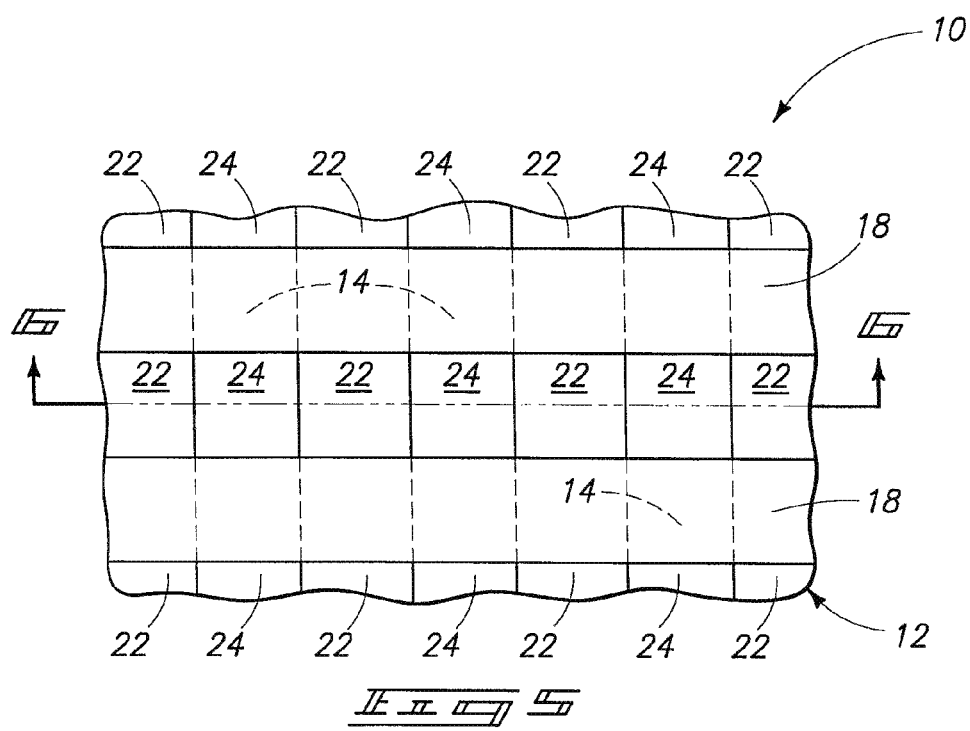
_FIG_ 5
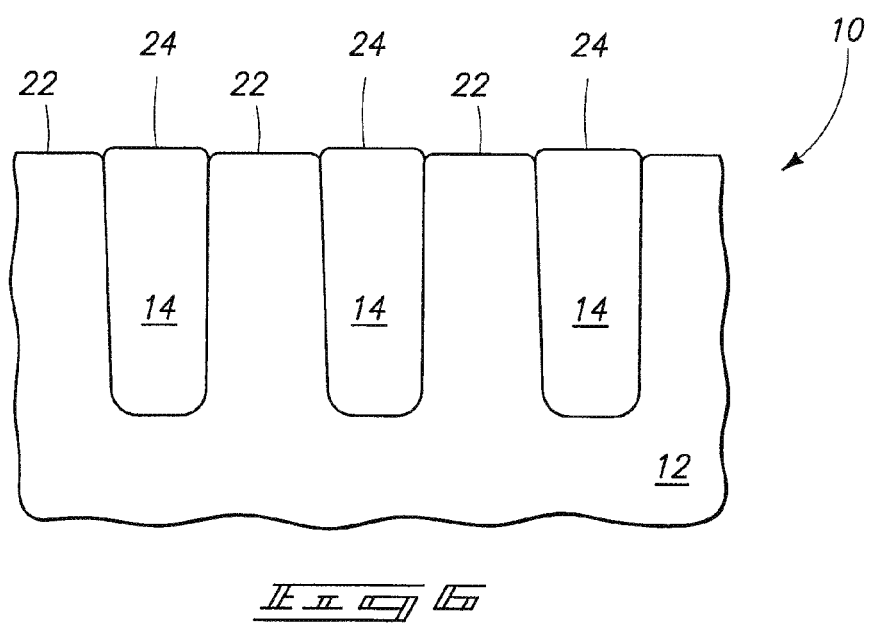
_FIG_ 6

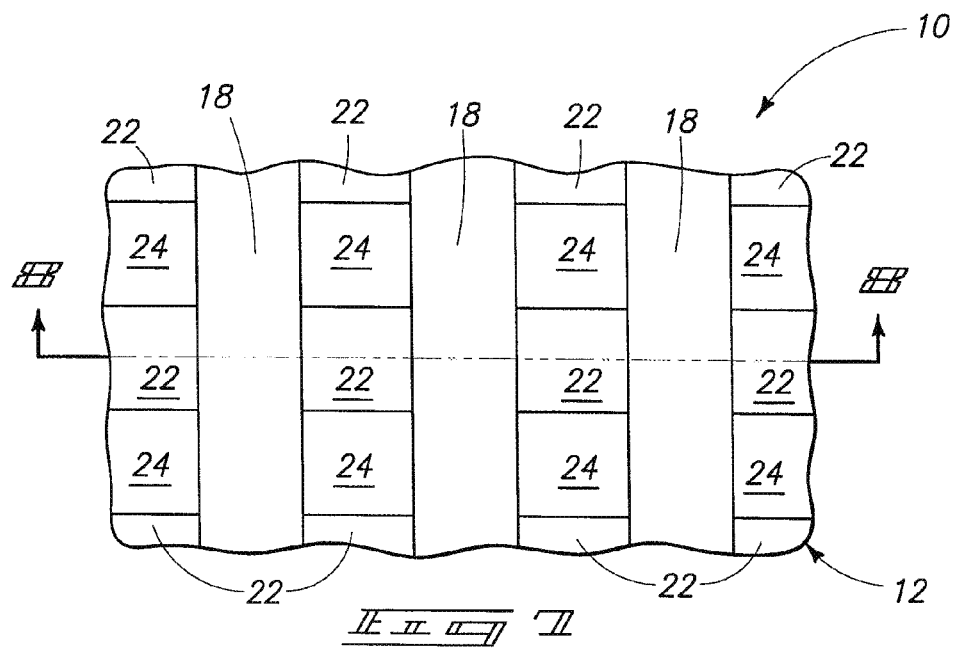
_FIG. 7_
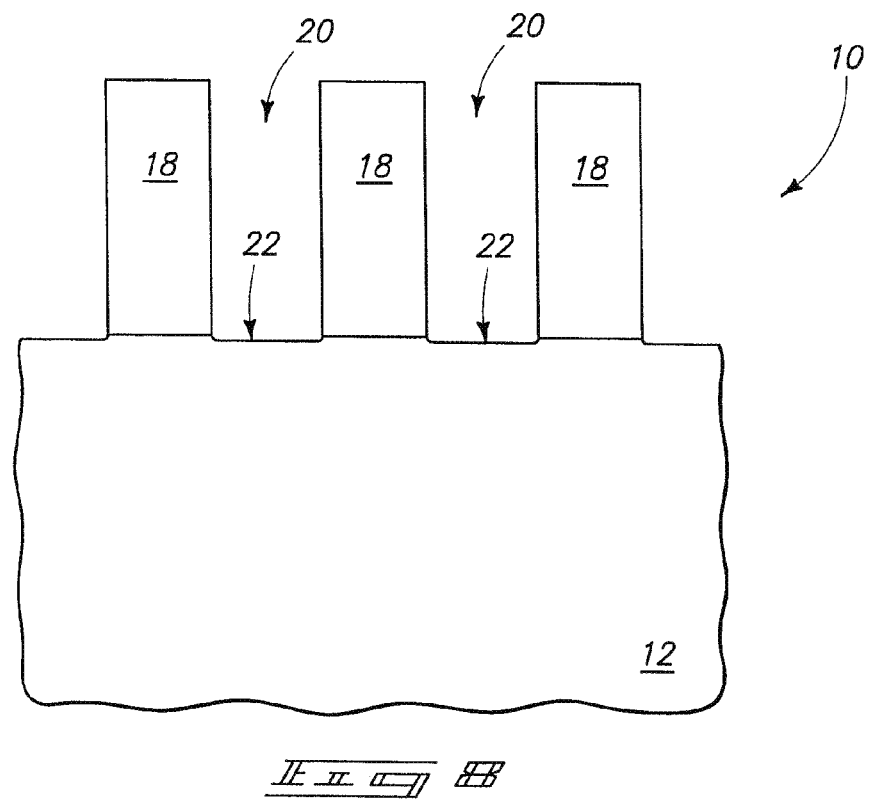
_FIG. 8_

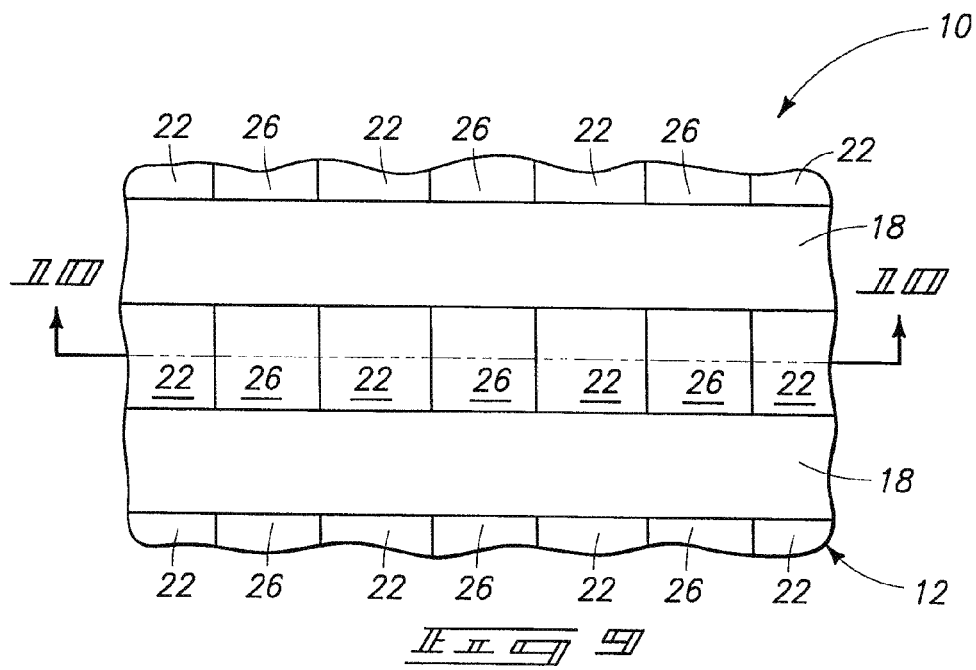
_FIG. 9_
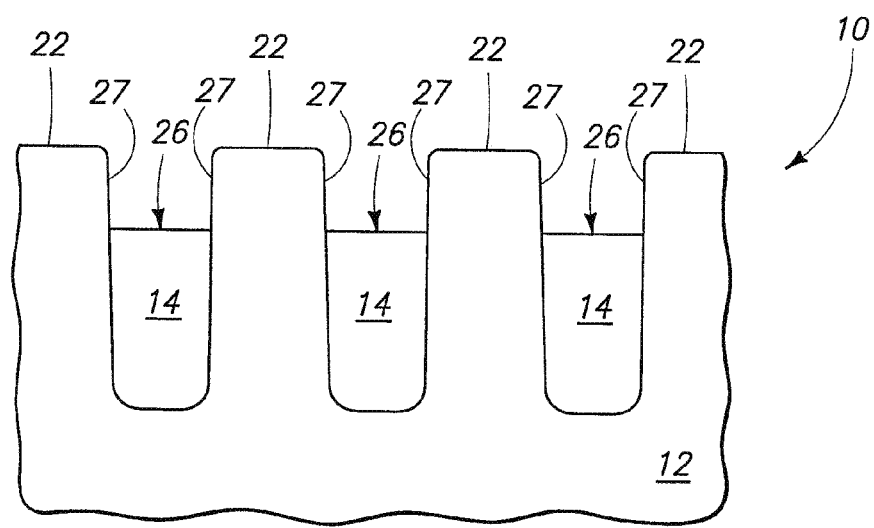
_FIG. 10_

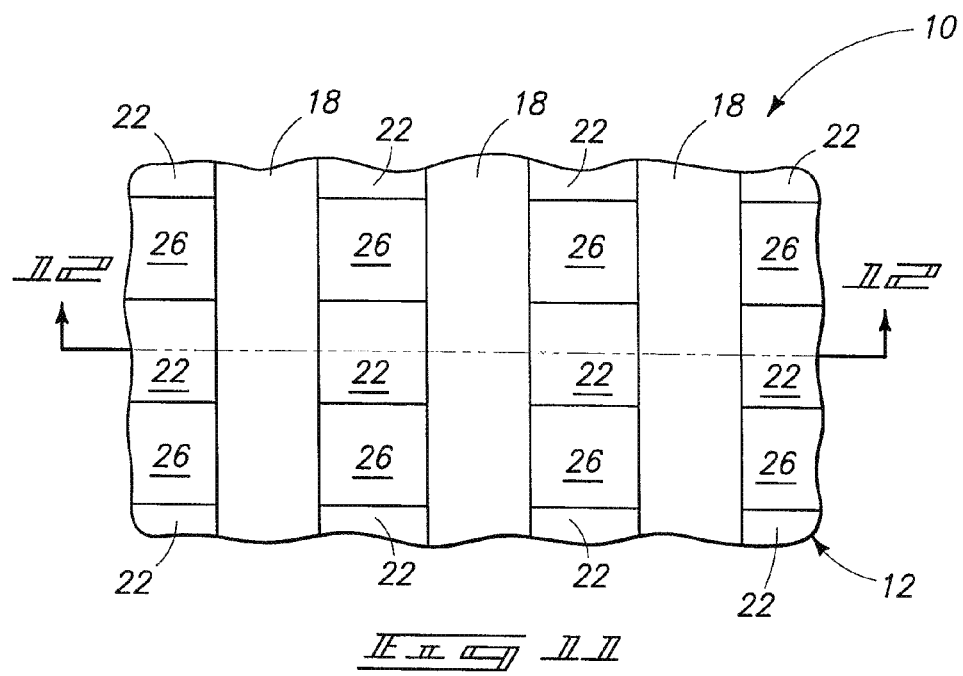
F I G 11
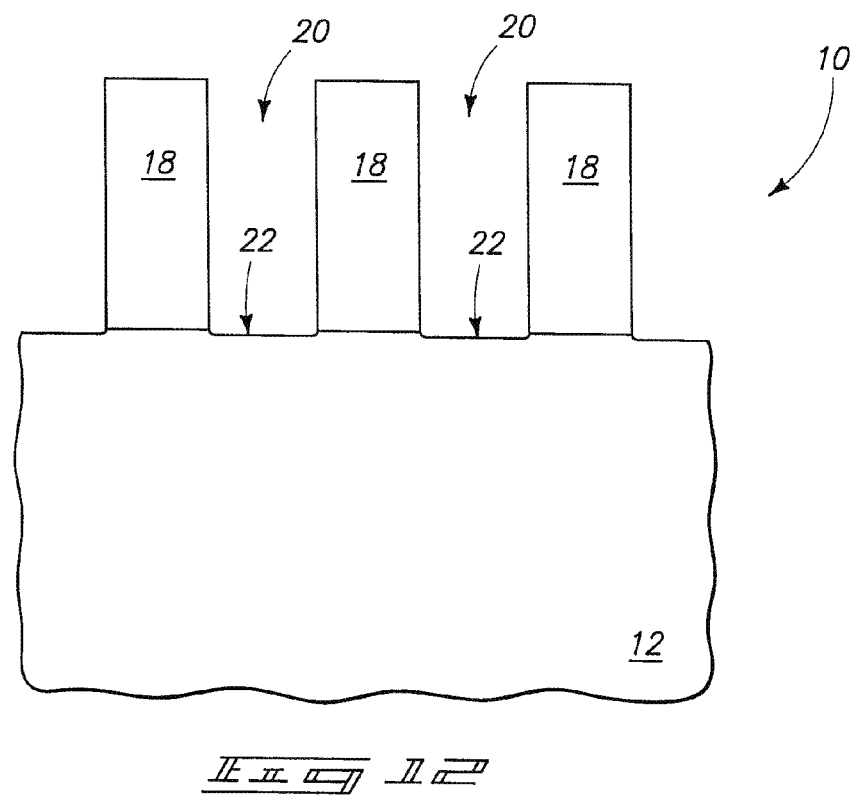
F I G 12

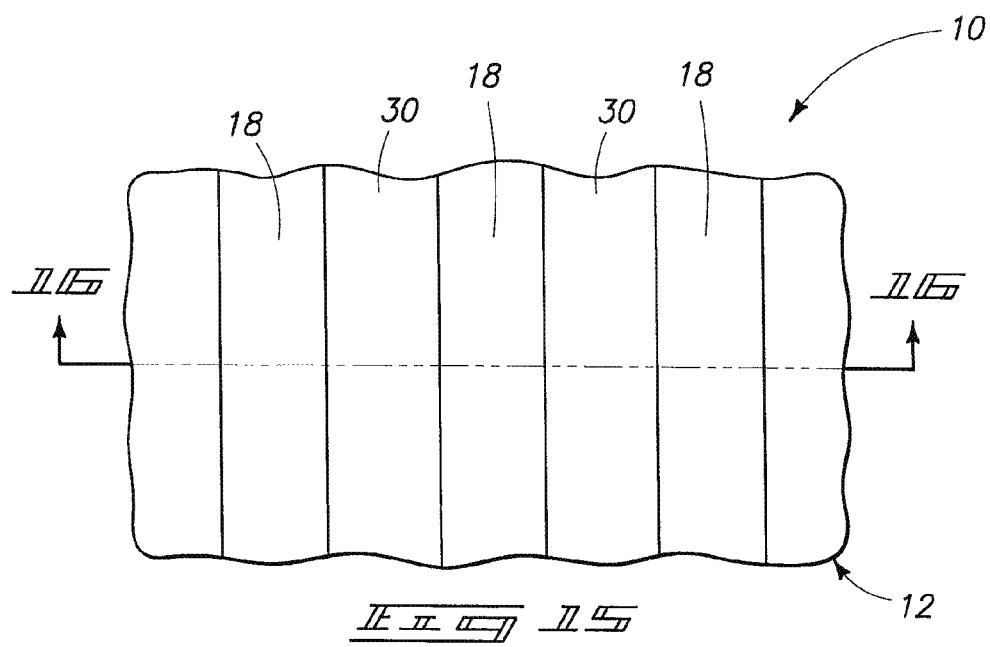
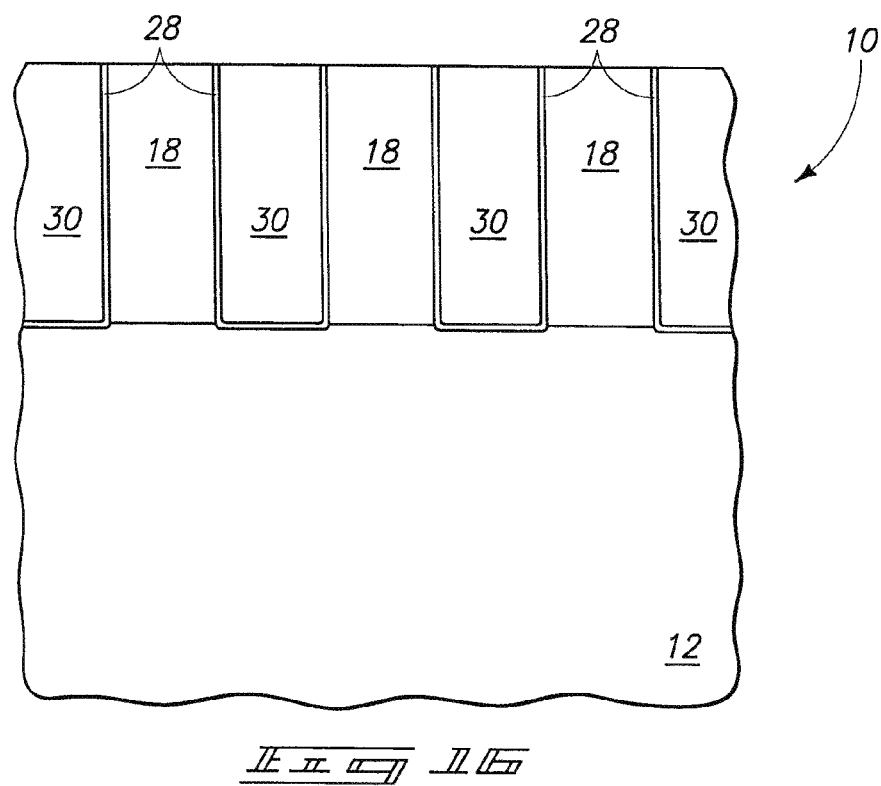

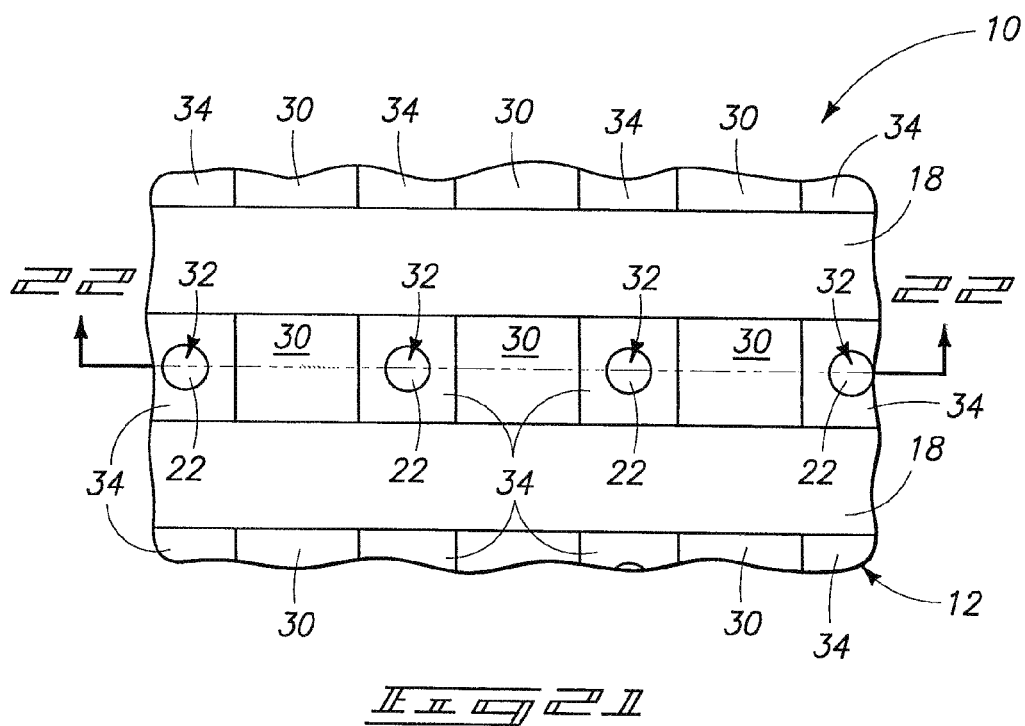
F I G 21
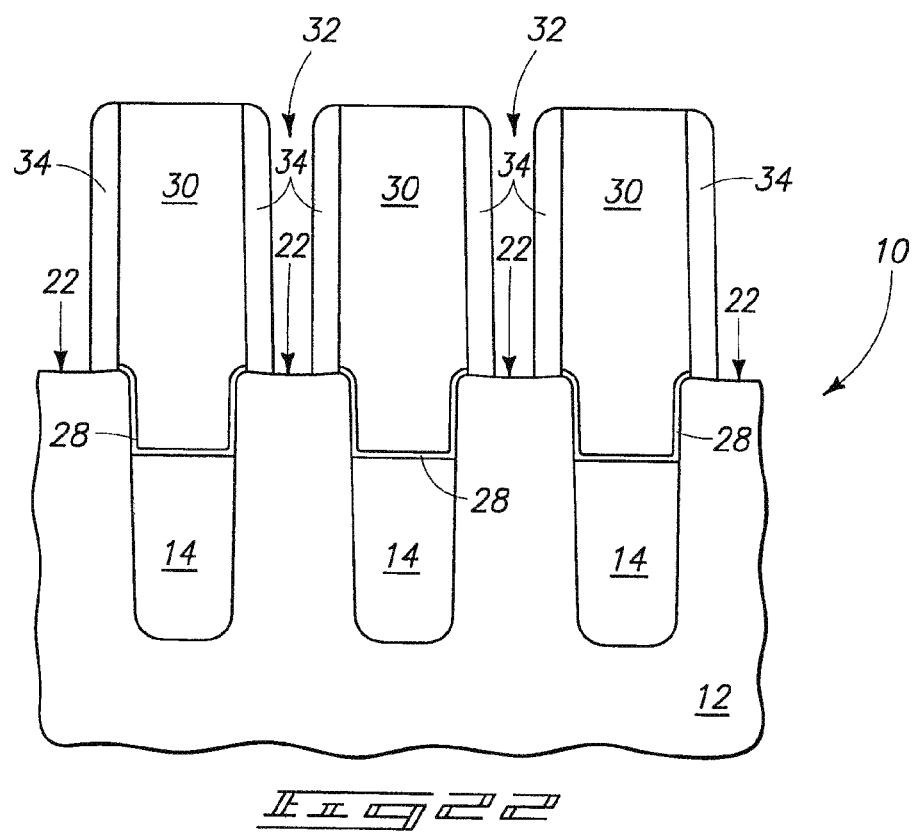
F I G 22

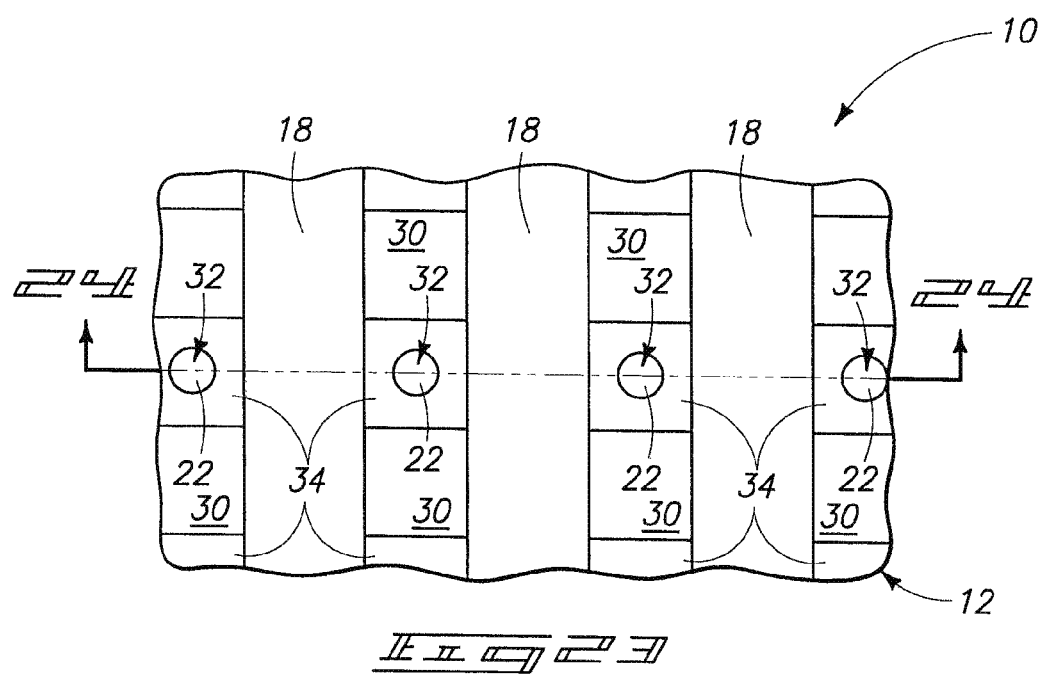
$F_{LT}$ $\varXi$ $\varXi$
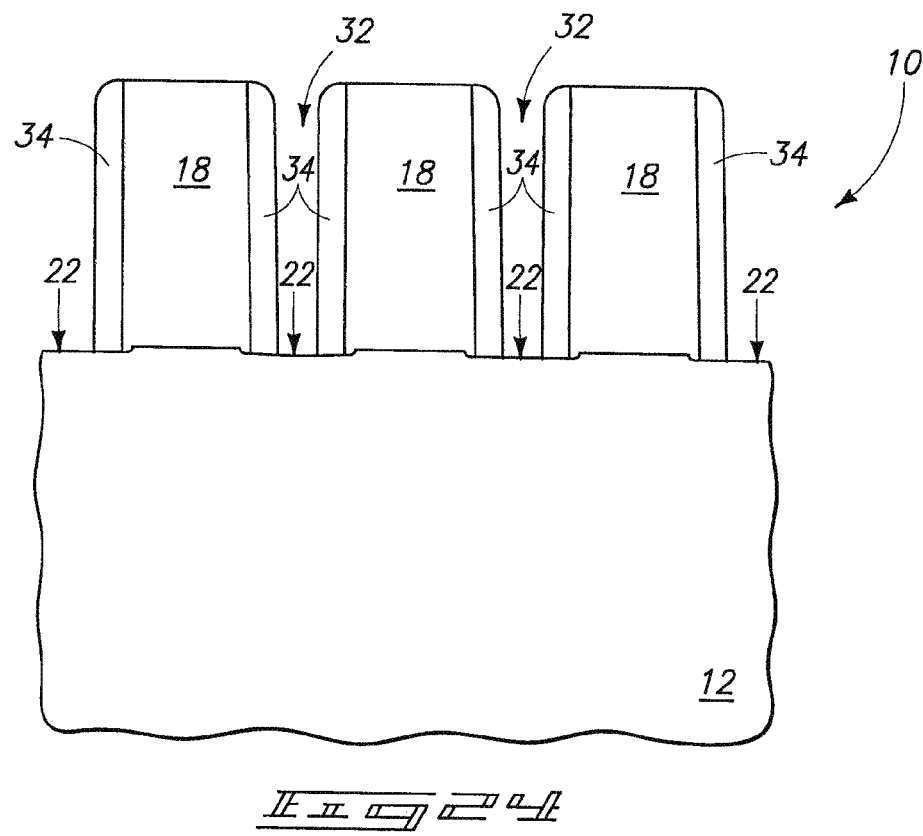
$F_{LT}$ $\varXi$ $\varXi$

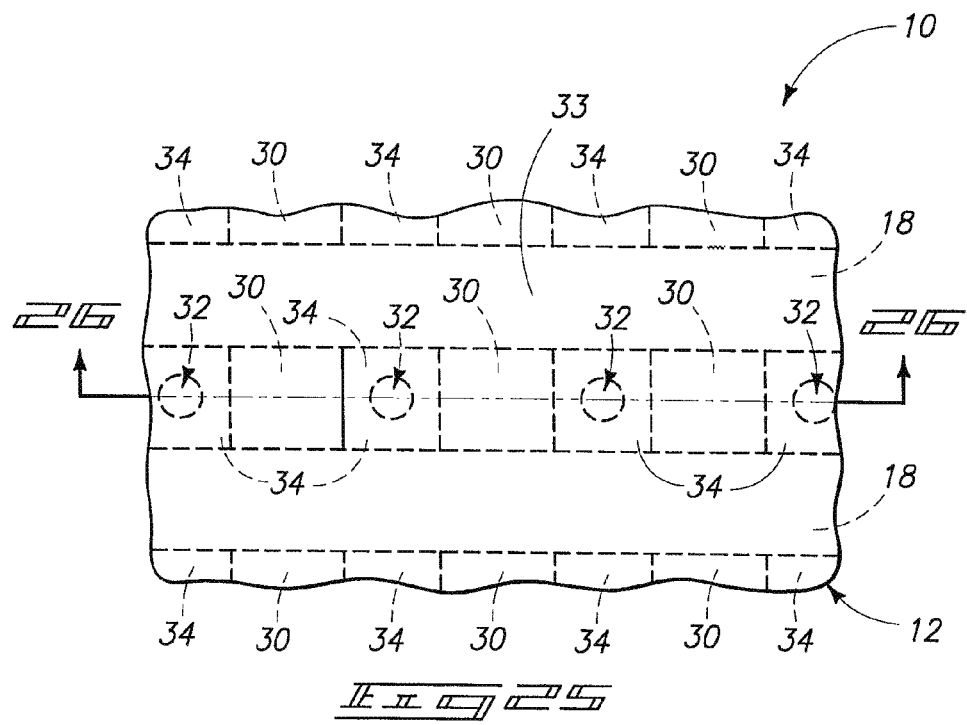
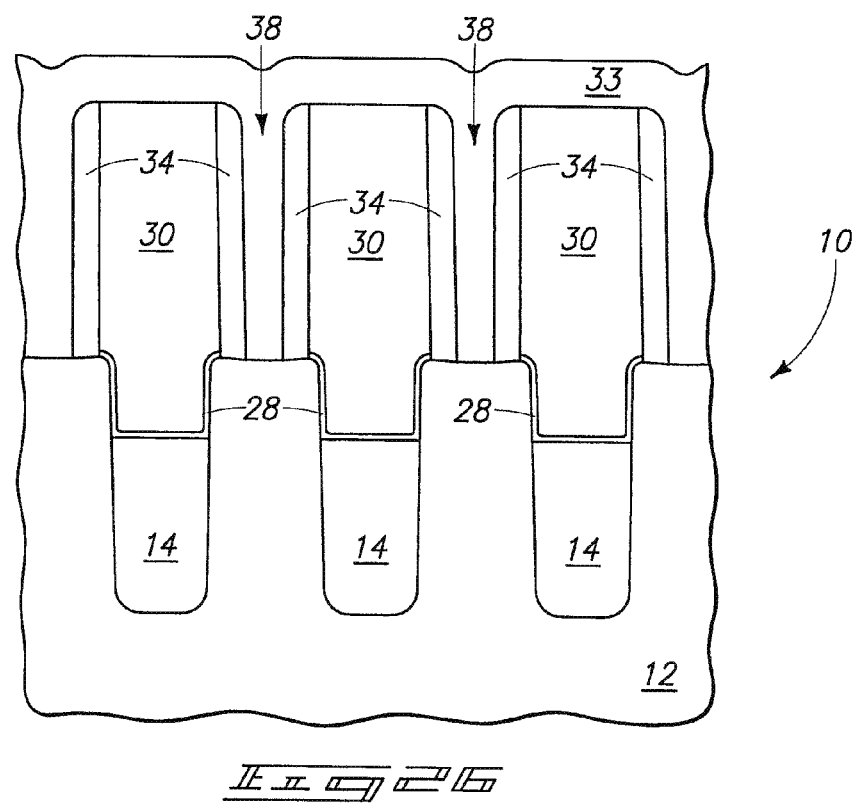

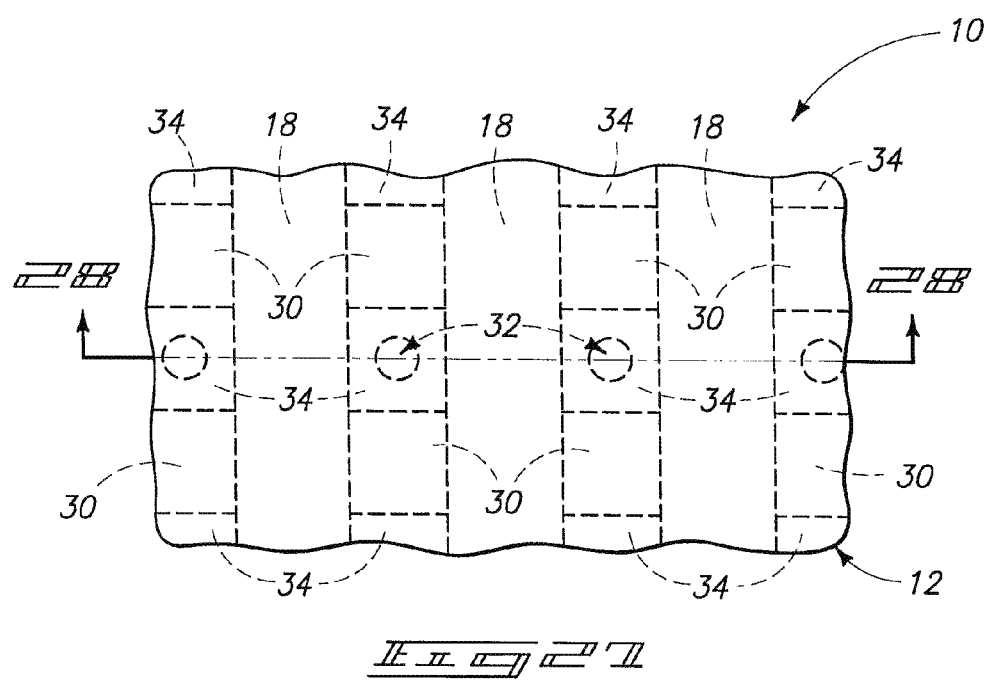
_Fig 27_
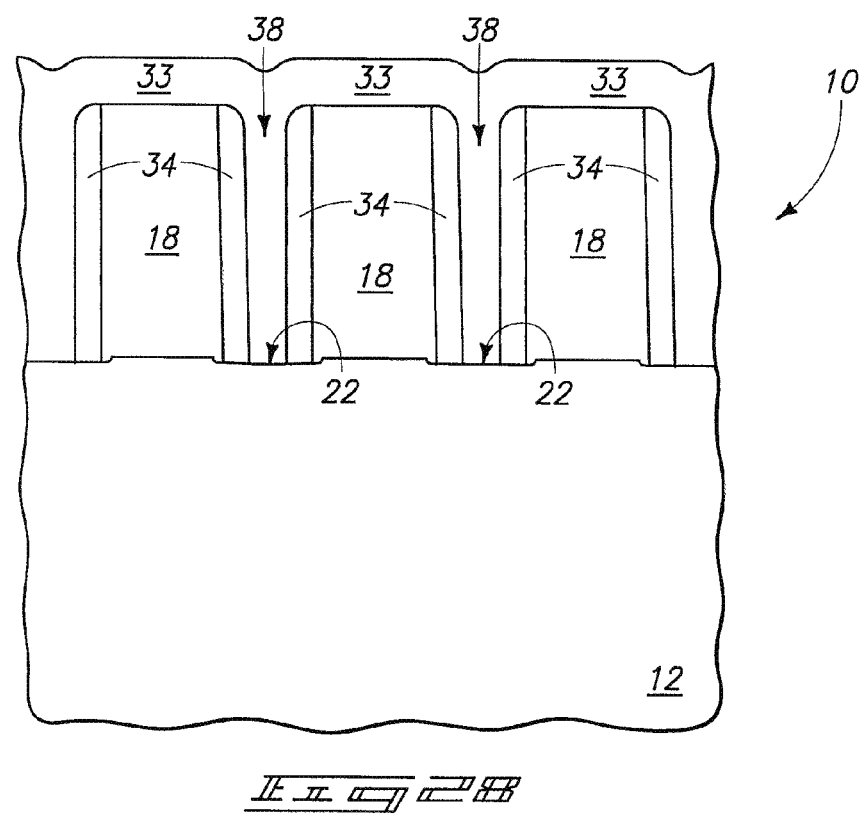
_Fig 28_

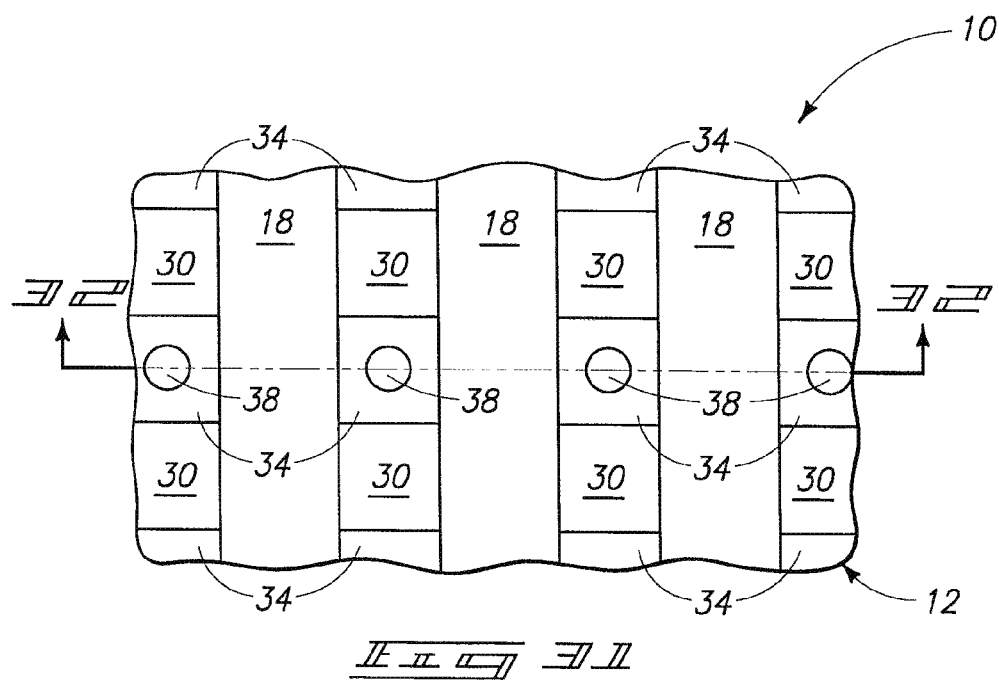
_FIG. 31_
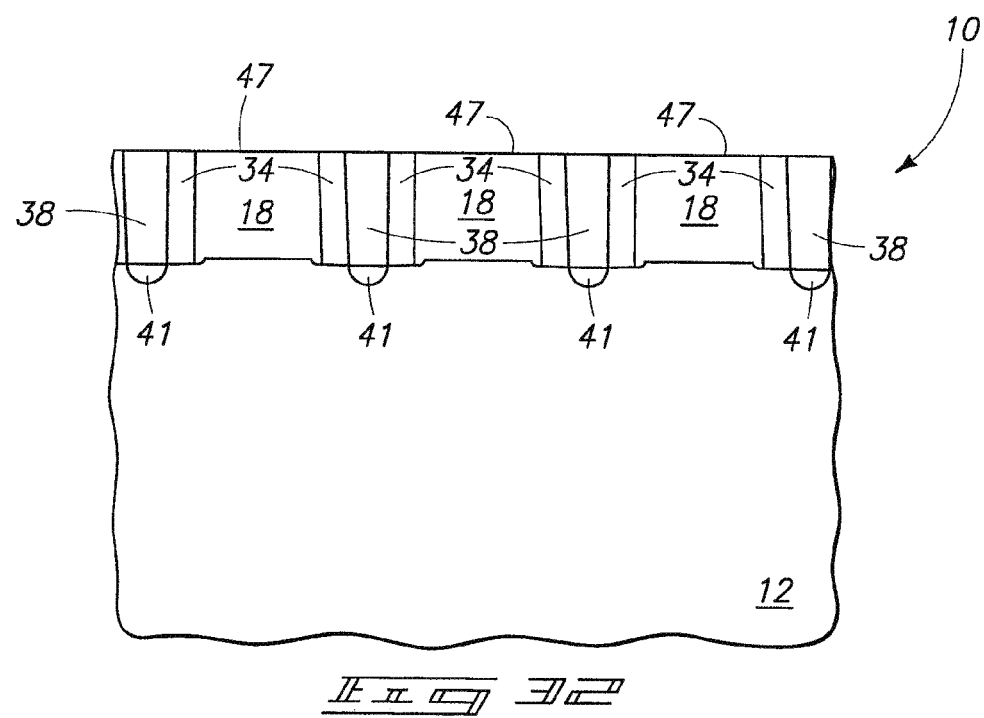
_FIG. 32_

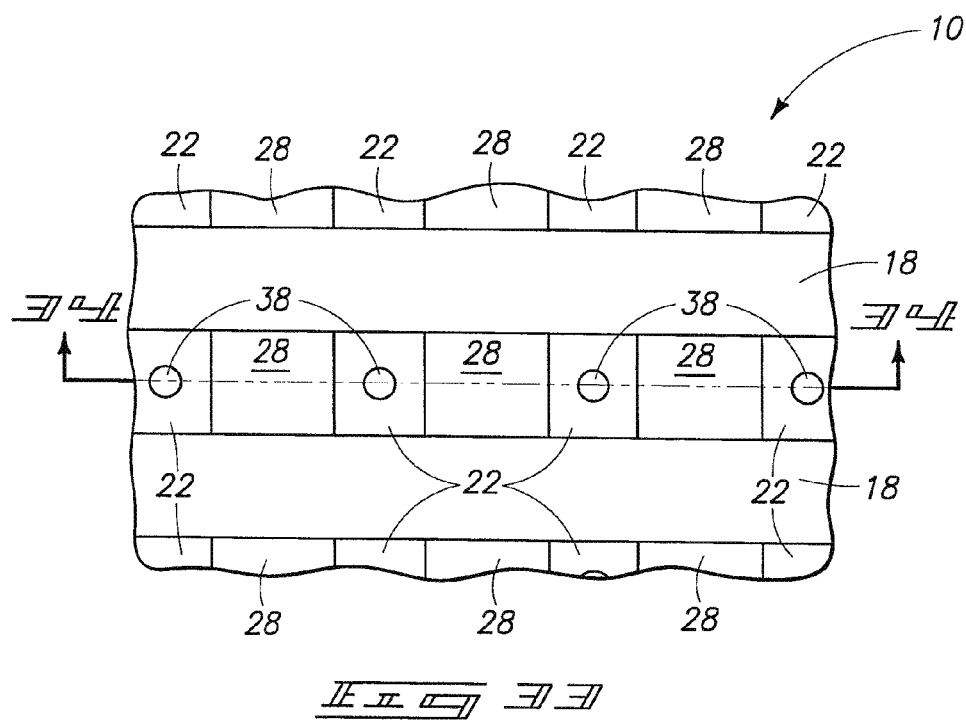
_FIG. 33_
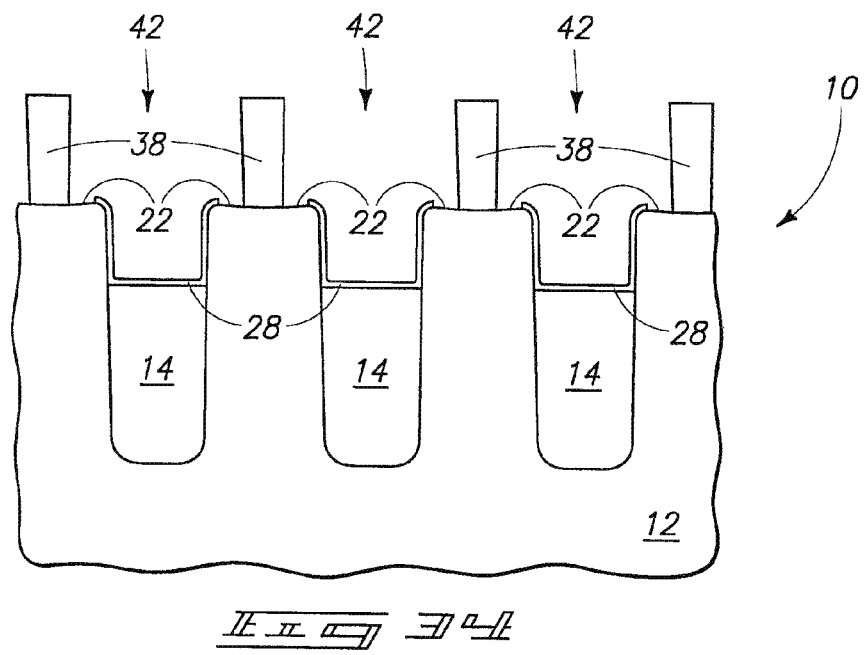
_FIG. 34_

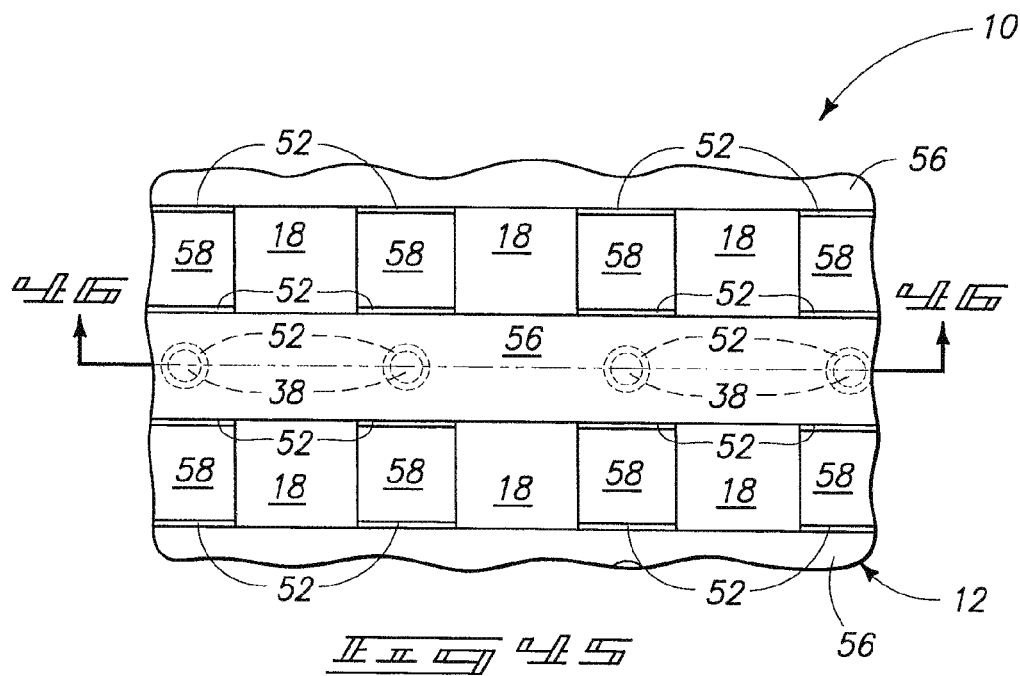
_FIG 45_
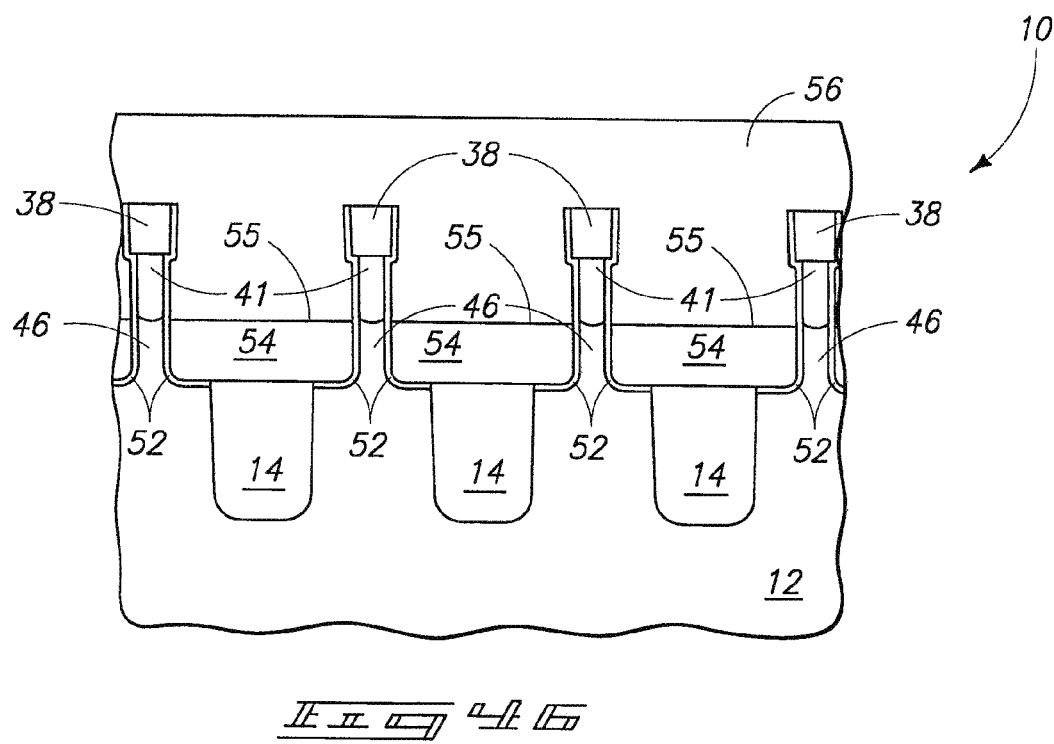
_FIG 46_

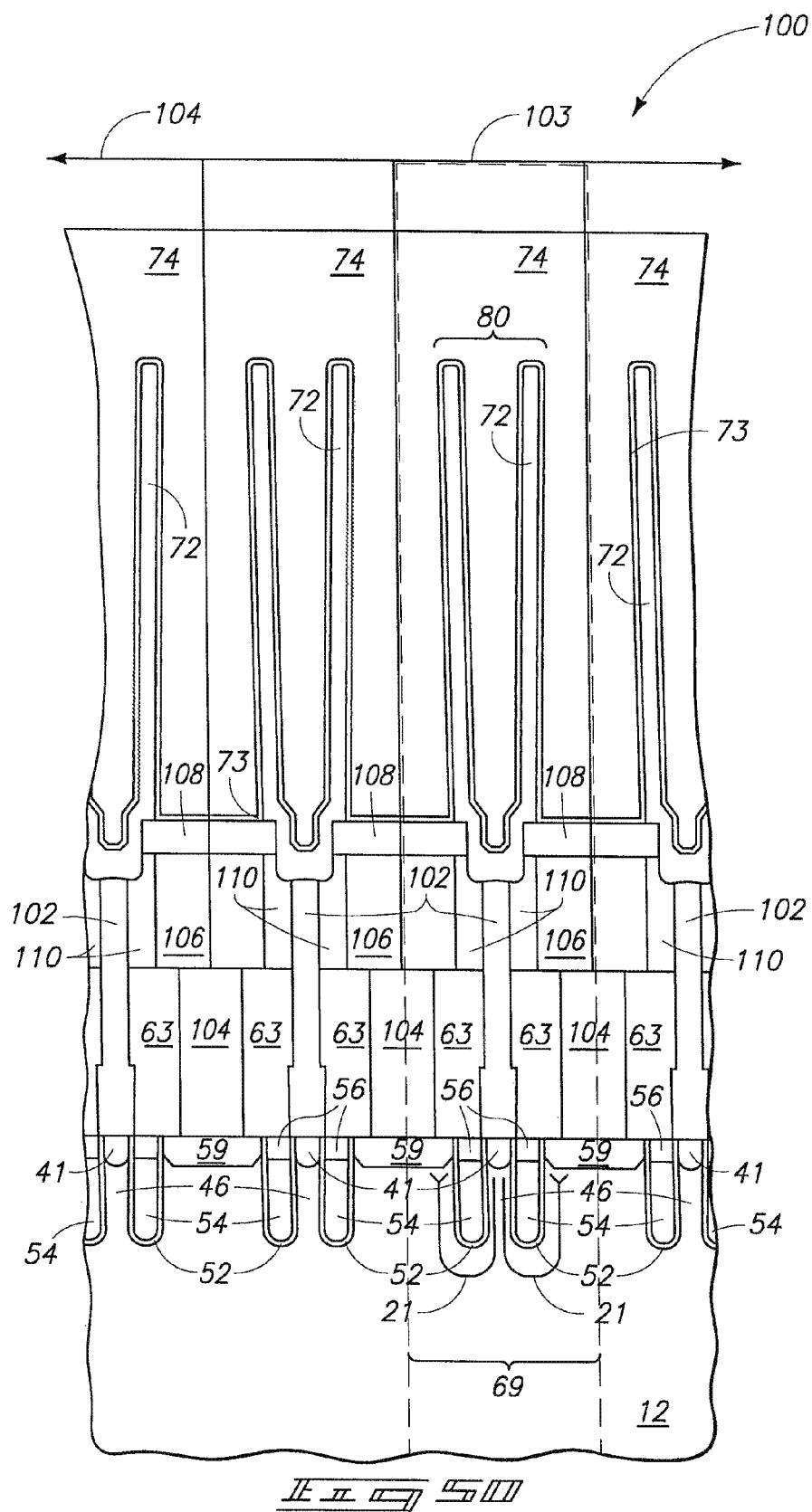

METHODS OF FABRICATING A MEMORY DEVICE

RELATED PATENT DATA

This patent resulted from a continuation application of U.S. patent application Ser. No. 12/703,502, filed Feb. 10, 2010, entitled "Semiconductor Memory Device", naming Gordon A. Haller, Sanh D. Tang and Steven Cummings as inventors which is a continuation of U.S. patent application Ser. No. 11/218,184, filed Aug. 31, 2005, entitled "Semiconductor Memory Device", naming Gordon A. Haller, Sanh D. Tang and Steven Cummings as inventors, now U.S. Pat. No. 7,696,567 which issued Apr. 13, 2010, the disclosures of which are incorporated by reference.

BACKGROUND OF THE INVENTION

1. Field of the Invention

This invention relates to microelectronic devices and related fabrication methods. More particularly, this invention relates to a memory device having a digit line that is directly coupled to a transistor source.

2. Description of the Related Art

Since the introduction of the digital computer, electronic storage devices have been a vital resource for the retention of data. Conventional semiconductor electronic storage devices, such as Dynamic Random Access Memory (DRAM), typically incorporate capacitor and transistor structures in which the capacitors temporarily store data based on the charged state of the capacitor structure. In general, this type of semiconductor Random Access Memory (RAM) often requires densely packed capacitor structures that are easily accessible for electrical interconnection.

A DRAM cell typically comprises a charge storage capacitor (or cell capacitor) coupled to an access device, such as a Metal-Oxide-Semiconductor Field Effect Transistor (MOSFET, or simply FET). These access devices functions to apply or remove charge on the capacitor, thus affecting a logical state defined by the stored charge. The amount of charge stored on the capacitor is determined by the electrode (or storage node) area and the interelectrode spacing. The conditions of DRAM operation such as operating voltage, leakage rate and refresh rate, will generally mandate that a certain minimum charge be stored by the capacitor.

FETs are widely used in integrated circuit devices including logic, memory and/or microprocessor devices that are used in consumer and/or industrial applications. As the integration density of integrated circuit FETs continues to increase, it may be desirable to continue to shrink the dimensions of the FETs. Conventionally, features of integrated circuit FETs may be formed on a microelectronic substrate, such as silicon semiconductor substrate, using photolithography and etching. As the minimum feature size is reduced, conventional fabrication techniques must also evolve in order to accurately fabricate the reduced size features. In some embodiments, fabrication of memory devices may be improved by reducing the number of processing steps involved in the fabrication process. In addition, improved transistor and charge storage devices may also decrease the manufacturing complexity, while maintaining or increasing the accuracy of the manufacturing process.

SUMMARY OF THE INVENTION

In one embodiment, a memory device comprising a vertical transistor includes a digit line that is directly coupled to the source regions of each memory cell. In typical prior art memory devices, an electrical plug is deposited on an upper surface of the source regions and the digit line is electrically coupled to the electrical plug. By removing the electrical plug from the transistor design, processing steps are removed and the possibility for manufacturing defects is also reduced. Exemplary methods for fabricating a memory device having a source region configured to be directly coupled to a digit line are described below with respect to the figures.

In another embodiment, a memory device comprising a vertical transistor includes gate regions that are recessed from an upper portion of a silicon substrate. With the gate regions recessed from the silicon substrate, the gate regions are spaced further from the source/drain regions and then in prior art vertical transistors and, accordingly, cross capacitance between the gate regions and the source/drain regions is reduced. By reducing cross capacitance between the gate region and the source/drain regions, the improved memory device design may increase accuracy of the memory device. Exemplary methods for fabricating a memory device having a recessed gate region are described below with respect to the figures.

In one embodiment, a memory device comprises a semiconductor substrate having a first surface, a recessed gate formed in the substrate and defining a first and second lateral sides, a first source/drain region formed on the first surface of the semiconductor substrate adjacent the first lateral side of the recessed gate, a second source/drain region formed on the first surface of the semiconductor substrate adjacent the second lateral side of the recessed gate, wherein application of a voltage to the recessed gate results in formation of a conductive channel between the first and second source/drain regions along a path that is recessed into the semiconductor substrate, a charge storage device formed above the semiconductor substrate, wherein the charge storage device is electrically coupled to the first source/drain region, and a conductive data line interposed between the charge storage device and the first surface of the semiconductor substrate wherein the conductive data line comprises a first portion that extends at a first height above the first surface of the semiconductor substrate and a second portion that extends downward from the first portion to electrically contact the second source/drain region, and wherein the first and second portions are formed of the same material.

In another embodiment, a method of fabricating a memory device comprises forming a semiconductor substrate having a first surface, forming a recessed gate in the substrate, wherein the recessed gate defines a first and second lateral sides, forming a first source/drain region on the first surface of the semiconductor substrate adjacent a first lateral side of the recessed gate, forming a second source/drain region on the first surface of the semiconductor substrate adjacent a second lateral side of the recessed gate, wherein application of a voltage to the gate results in the formation of a conductive channel between the first and second source/drain regions along a path that is recessed into the semiconductor substrate, forming a conductive data line between the charge storage device and the first surface of the semiconductor substrate, wherein the conductive data line comprises a first portion that extends a first height above the first surface of the semiconductor substrate and a second portion that extends downward from the first portion to electrically contact the second source/drain region, and wherein the first and second portions are formed of the same material, and forming a charge storage device above the semiconductor substrate, wherein the charge storage device is electrically coupled to the first source/drain region.

In another embodiment, a memory device comprises a semiconductor substrate, a vertically extending gate region recessed in the substrate, a source region positioned on a first side of the gate, the source region being formed at least partially in the semiconductor substrate, a drain region positioned on a second side of the gate, wherein the second side is opposite the first side, and a digit line contact directly electrically connected to the source region and directly electrically connected to a digit line contact of the memory device.

In another embodiment, a memory device comprises a source region, a drain region, a gate region separating the source and drain regions, and means for directly electrically coupling a digit line electrode of the memory device to the source region.

In another embodiment, a memory array comprises a plurality of memory cells. In one embodiment, the array comprises a semiconductor substrate having a first surface, a plurality of recessed gates formed in the substrate, each defining respective first and second lateral sides, a plurality of first source/drain regions formed on the first surface of the semiconductor substrate adjacent respective first lateral sides of each recessed gate, a plurality of second source/drain regions formed on the first surface of the semiconductor substrate adjacent respective second lateral sides of each recessed gate, wherein application of a voltage to each gate results in the formation of a conductive channel between the respective first and second source/drain regions on either side of the gate along a path that is recessed into the semiconductor substrate, a plurality of charge storage devices formed above the semiconductor substrate, wherein the charge storage devices are electrically coupled to respective first source/drain regions, and a plurality of conductive data lines interposed between each the charge storage devices and the first surface of the semiconductor substrate. In one embodiment, the conductive data lines each comprise a first portion that extends at a first height above the first surface of the semiconductor substrate, and a second portion that extends downward from the first portion to electrically contact the second source/drain region.

In another embodiment, a memory device comprises a semiconductor substrate having a first surface, a recessed gate that is formed in the substrate so as to be spaced a first distance from the first surface, wherein the recessed gate defines a first and second lateral sides, a first source/drain region formed on the first surface of the semiconductor substrate adjacent a first lateral side of the recessed gate, a second source/drain region formed on the first surface of the semiconductor substrate adjacent a second lateral side of the recessed gate wherein the application of voltage to the gate results in the formation of a conductive channel between the first and second source/drain regions along a path that is recessed into the semiconductor substrate and wherein the first distance is selected such that the gate structure is substantially located below the first and second source/drain regions so as to reduce the cross-capacitance between the gate and the first and second source/drain regions, a charge storage device formed above the semiconductor substrate wherein the charge storage device is electrically coupled to the first source/drain region, and a conductive data line interposed between the charge storage device and the first surface of the semiconductor substrate wherein the conductive data line electrically couples to the charge storage device when the gate is activated so as to transmit a signal indicative of the charge state of the charge storage device.

In another embodiment, a memory device comprises a semiconductor substrate having a top surface, an active area positioned on a first side of the gate, the active area being formed in the semiconductor substrate, and a vertically extending gate positioned proximate the active area, wherein a top surface of the gate is elevationally below the top surface of the semiconductor substrate.

BRIEF DESCRIPTION OF THE DRAWINGS

FIG. 1 is a top view of a portion of a memory device at an initial processing stage.

FIG. 2 is a cross-sectional view taken a long line 2-2 of FIG. 1.

FIG. 5 is a top view of the memory device 10 at a processing stage subsequent to that of FIG. 3.

FIG. 6 is a cross-sectional view of the memory device 10 at a processing stage subsequent to that of FIG. 4.

FIG. 7 is a top view of the memory device 10 rotated 90° from the embodiment illustrated in FIG. 5.

FIG. 8 is a cross-sectional view of the memory device 10 rotated 90° from the embodiment illustrated in FIG. 6.

FIG. 9 is a top view of the memory device 10 at a processing stage subsequent to that of FIG. 5.

FIG. 10 is a cross-sectional view of the memory device 10 at a processing stage subsequent to that of FIG. 6.

FIG. 11 is a top view of the memory device 10 rotated 90° from the embodiment illustrated in FIG. 9.

FIG. 12 is a cross-sectional view of the memory device 10 rotated 90° from the embodiment illustrated in FIG. 10.

FIG. 15 is a top view of the memory device 10 rotated 90° from the embodiment illustrated in FIG. 13.

FIG. 16 is a cross-sectional view of the memory device 10 rotated 90° from the embodiment illustrated in FIG. 14.

FIG. 21 is a top view of the memory device 10 at a processing stage subsequent to that of FIG. 17.

FIG. 22 is a cross-sectional view of the memory device 10 at a processing stage subsequent to that of FIG. 18.

FIG. 23 is a top view of the memory device 10 rotated 90° from the embodiment illustrated in FIG. 21.

FIG. 24 is a cross-sectional view of the memory device 10 rotated 90° from the embodiment illustrated in FIG. 22.

FIG. 25 is a top view of the memory device 10 at a processing stage subsequent to that of FIG. 21.

FIG. 26 is a cross-sectional view of the memory device 10 at a processing stage subsequent to that of FIG. 22.

FIG. 27 is a top view of the memory device 10 rotated 90° from the embodiment illustrated in FIG. 25.

FIG. 28 is a cross-sectional view of the memory device 10 rotated 90° from the embodiment illustrated in FIG. 26.

FIG. 31 is a top view of the memory device 10 rotated 90° from the embodiment illustrated in FIG. 29.

FIG. 32 is a cross-sectional view of the memory device 10 rotated 90° from the embodiment illustrated in FIG. 30.

FIG. 33 is a top view of the memory device 10 at a processing stage subsequent to that of FIG. 29.

FIG. 34 is a cross-sectional view of the memory device 10 at a processing stage subsequent to that of FIG. 30.

FIG. 45 is a top view of the memory device 10 at a processing stage subsequent to that of FIG. 41.

FIG. 46 is a cross-sectional view of the memory device 10 at a processing stage subsequent to that of FIG. 42.

FIG. 50 is a cross-sectional view of the memory device 10 (at the same orientation as FIG. 48) at a subsequent processing stage.

DETAILED DESCRIPTION OF THE PREFERRED EMBODIMENT

Embodiments of the invention will now be described with reference to the accompanying figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

FIGS. 1 and 2 illustrate a semiconductor substrate 12 having shallow trench isolation (STI) regions 14. More particularly, FIG. 1 is a top view of a portion of a memory device 10 at an initial processing stage, wherein the memory device 10 includes the substrate 12 patterned with STI regions 14 and pillars 16. As illustrated in FIG. 1, the STI regions 14 and pillars 16 alternate in the substrate 12. FIG. 2 is a cross-sectional view taken a long line 2-2 of FIG. 1. As illustrated in FIG. 2, the STI regions 14 form pillars 16 in the substrate 12.

Figure 3:
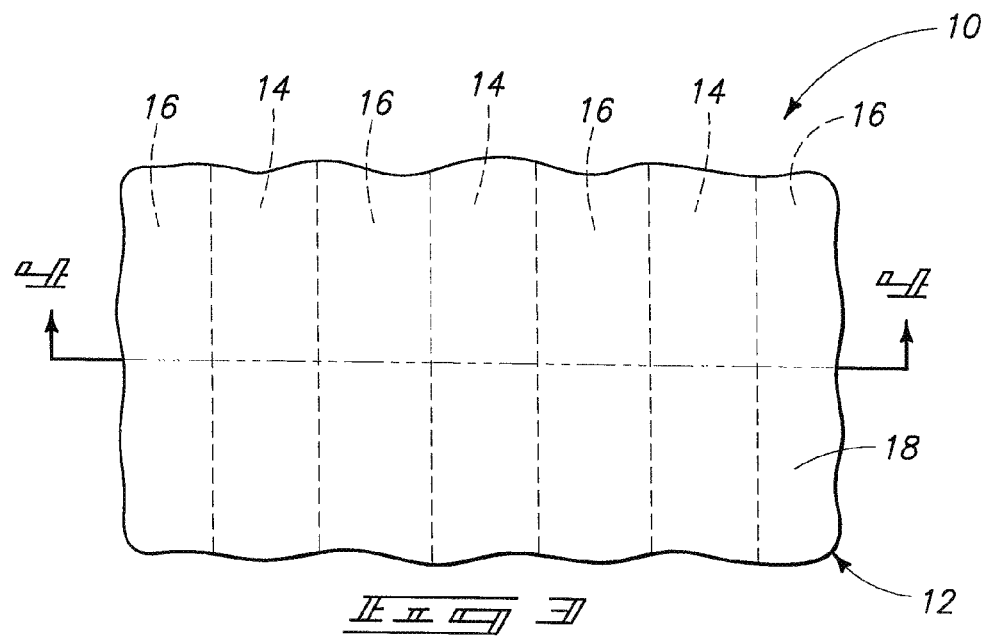
FIG. 3 is a top view of the memory device illustrated in FIG. 1 at a subsequent processing stage.
Figure 4:
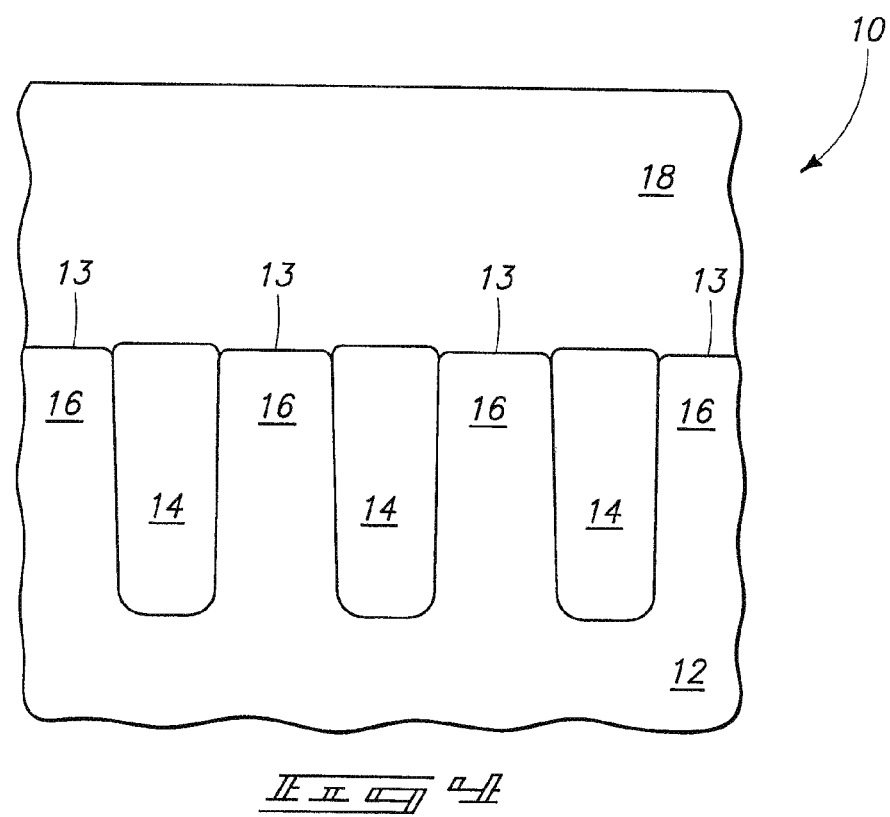
FIG. 4 is a cross-sectional view of the memory device illustrated in FIG. 1 at a subsequent processing stage.

FIGS. 3 and 4 are top and cross-sectional views, respectively, of the memory device 10 at processing stage subsequent to the embodiment illustrated in FIGS. 1 and 2. As illustrated in FIGS. 3 and 4, a nitride layer 18 has been deposited on the upper services of the pillars 16 and STI regions 14. The dashed lines in FIG. 3 indicate surfaces that are not visible from the top view. Thus, the pillars 16 and STI regions 14 are not visible from the top view illustrated in FIG. 3, due to the deposition of nitride layer 18 on top of these surfaces. In one embodiment, the nitride layer 18 has a thickness in the range of about 2000 to 3000 Angstroms. In other embodiments, however, the thickness of the nitride layer 18 may be adjusted according to various design parameters.

FIGS. 5-8 are views of the memory device 10 at a processing stage subsequent to that of FIGS. 3 and 4. More particularly, FIGS. 5 and 6 are top and cross-sectional views, respectively, and FIGS. 7 and 8 are top and cross-sectional views, respectively, rotated 90° from the embodiments illustrated in FIGS. 5 and 6. As illustrated in FIG. 8, for example, the nitride layer 18 has been patterned and etched to form trenches 20 in the nitride layer 18. In the embodiment of FIG. 8, the trenches 20 extend to an upper surface 22 of the substrate 12. The trenches 20 also expose isolation region portions 24 of the STI regions 14. As illustrated in FIGS. 5-8, the nitride layer 18 is now patterned so that nitride runners (designated with numeral 18) extend vertically from the substrate 12 and are generally separated by the trenches 20 and are parallel to one another. As illustrated in FIG. 7, for example, the upper surface portions 22 of the substrate 12 are generally surrounded by the isolation region portions 24 and the nitride runners 18. In one embodiment, the upper surface portions 22 are generally shaped as squares.

FIGS. 9-12 are views of the memory device 10 at a processing step subsequent to that of FIGS. 5-8. More particularly, FIGS. 9 and 10 are top and cross-sectional views, respectively, of the memory device 10 and FIGS. 11 and 12 are top and cross-sectional views, respectively, of the memory device 10 rotated 90° from the embodiments illustrated in FIGS. 9 and 10. As illustrated in FIG. 10, for example, isolation region portions 24 (FIG. 6) are etched below the upper surface portions 22 of substrate 12 in order to expose recessed surfaces 26 of the STI regions 14. In one embodiment, the isolation region portions 24 are etched using a reactive ion etch (RIE) process to selectively etch material 14 relative to the nitride runners 18. As shown in FIG. 10, the etch process exposes sidewalls 27 of the substrate 12 which were originally covered by an insulative material deposited in the STI regions 14. In one embodiment, the recessed surfaces 26 are in the range of about 500 to 1500 Angstroms below the upper surface portions 22 of the substrate 12. In another embodiment, the recessed surfaces 26 are in the range of about 800 to 1200 Angstroms below the upper surface portions 22 of the substrate 12. In other embodiments, the recessed surfaces 26 may extend other distances below the upper surface portions 22.

In one embodiment, after the recessed surfaces 26 are exposed using an etching process, for example, residual oxide on the sidewalls 27 and upper surface portions 22 is removed. In one embodiment, a wet hydrofluoric (HF) etch is used to remove these residual oxides. In other embodiments, other clean etches may be used in order to achieve similar results.

Figure 13:
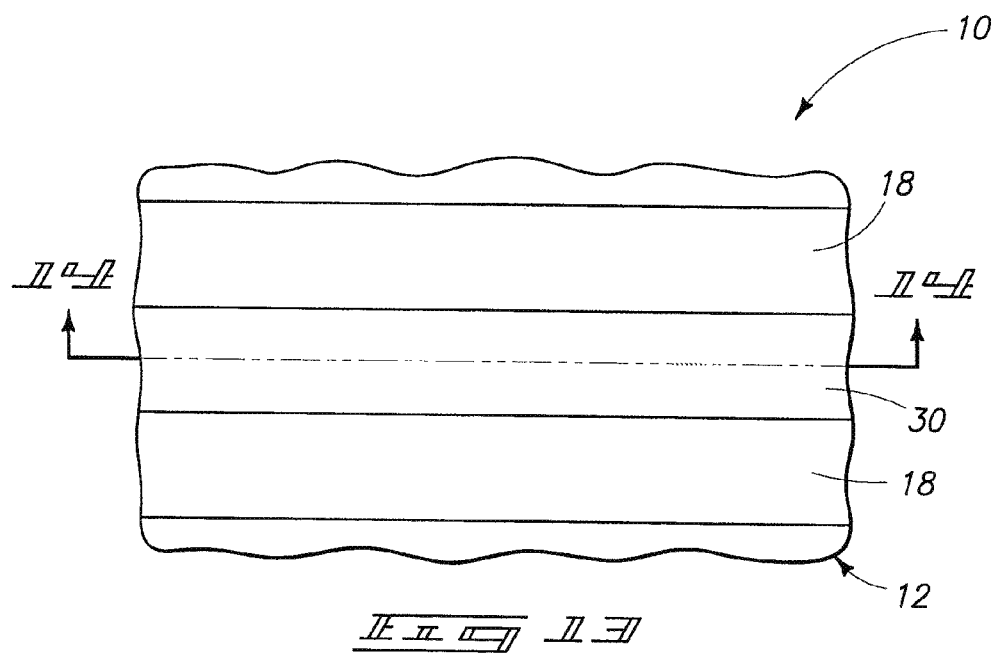
FIG. 13 is a top view of the memory device 10 at a processing stage subsequent to that of FIG. 9.
Figure 14:
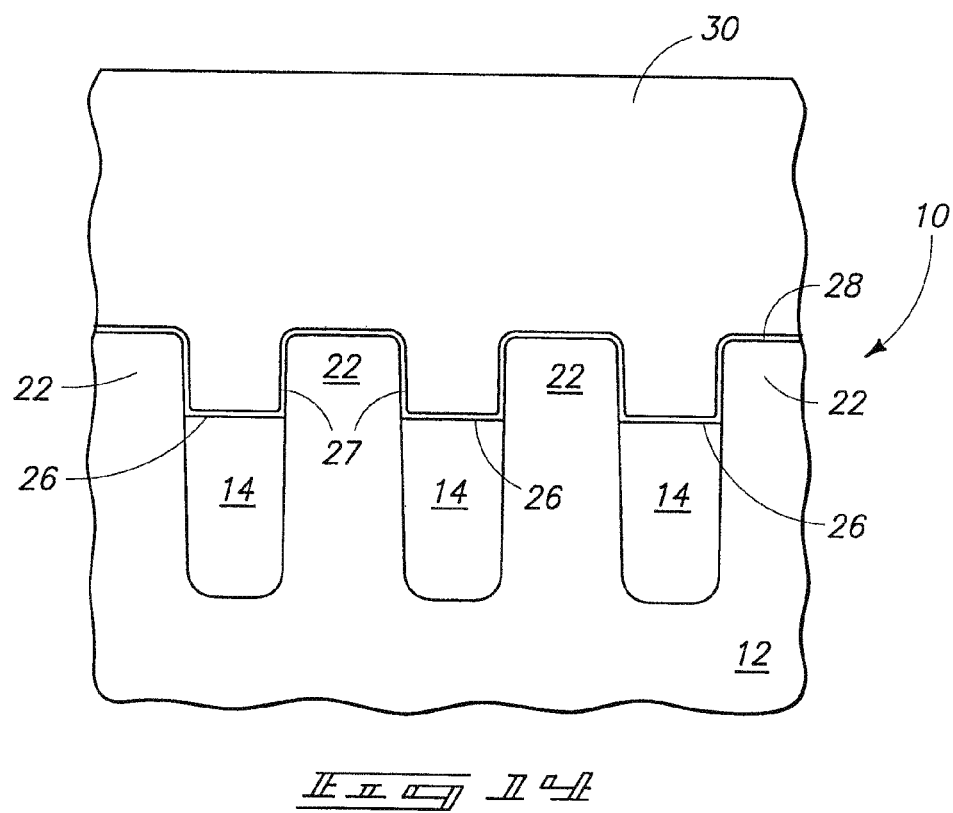
FIG. 14 is a cross-sectional view of the memory device 10 at a processing stage subsequent to that of FIG. 10.

FIGS. 13-16 are views of the memory device 10 at a processing step subsequent to that of FIGS. 9-12. More particularly, FIGS. 13 and 14 are top and cross-sectional views, respectively, of the memory device 10 and FIGS. 15 and 16 are top and cross-sectional views, respectively, of the memory device 10 rotated 90° from the embodiments illustrated in FIGS. 13 and 14. As illustrated in FIGS. 14 and 16, for example, a nitride liner 28 has been deposited on the upper surface 22 of the substrate 12, the recessed surfaces 26, and the sidewalls 27. In one embodiment, the nitride liner 28 has a thickness in the range of about 30 to 100 Angstroms.

After depositing the nitride liner 28, a sacrificial layer 30, such as a spin-on-glass (SOG), for example, is deposited in the trenches 20 (FIG. 12) between the nitride runners 18. In other embodiments, the sacrificial layer may comprise other materials, such as borophosphorous silica glass (BPSG) and/or TEOS. In one embodiment, the sacrificial layer 30 is etched so that the sacrificial layer 30 is planar with the nitride runners 18. In one embodiment, the sacrificial layer 30 is removed using a chemical mechanical polishing (CMP) process; however other etching processes may be used in order to adjust a height of the sacrificial layer 30.

Figure 17:
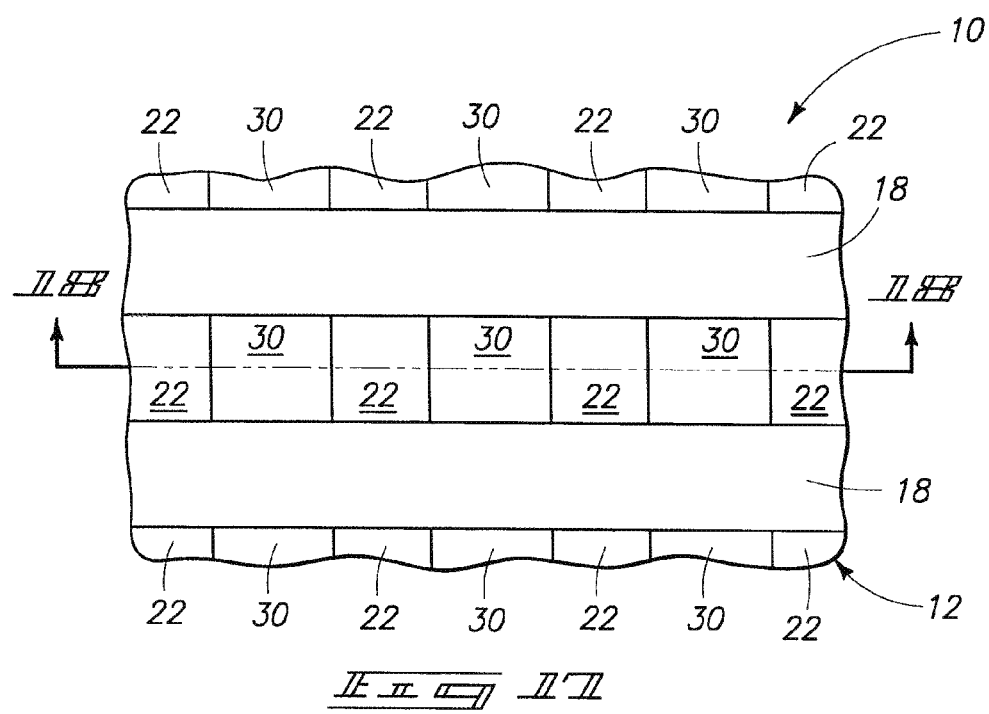
FIG. 17 is a top view of the memory device 10 at a processing stage subsequent to that of FIG. 13.
Figure 18:
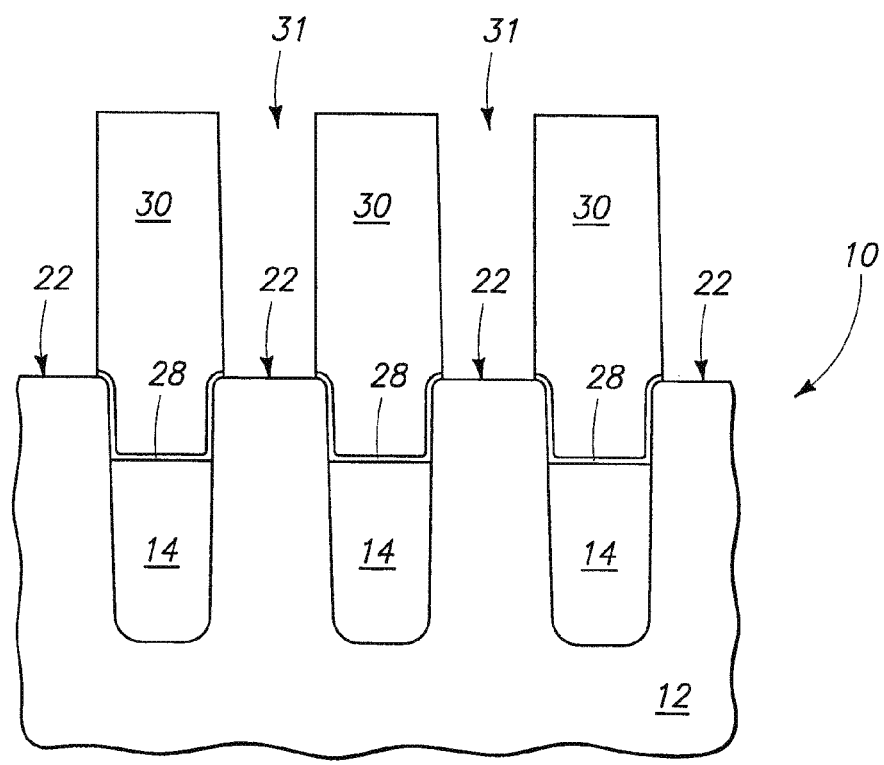
FIG. 18 is a cross-sectional view of the memory device 10 at a processing stage subsequent to that of FIG. 14.
Figure 19:
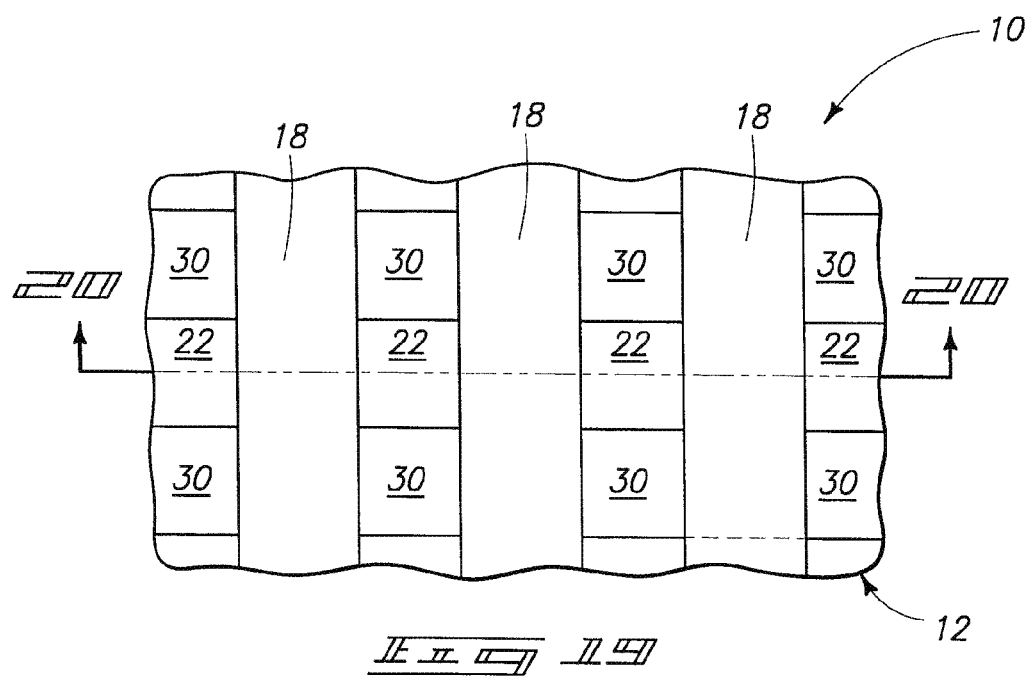
FIG. 19 is a top view of the memory device 10 rotated 90° from the embodiment illustrated in FIG. 17.
Figure 20:
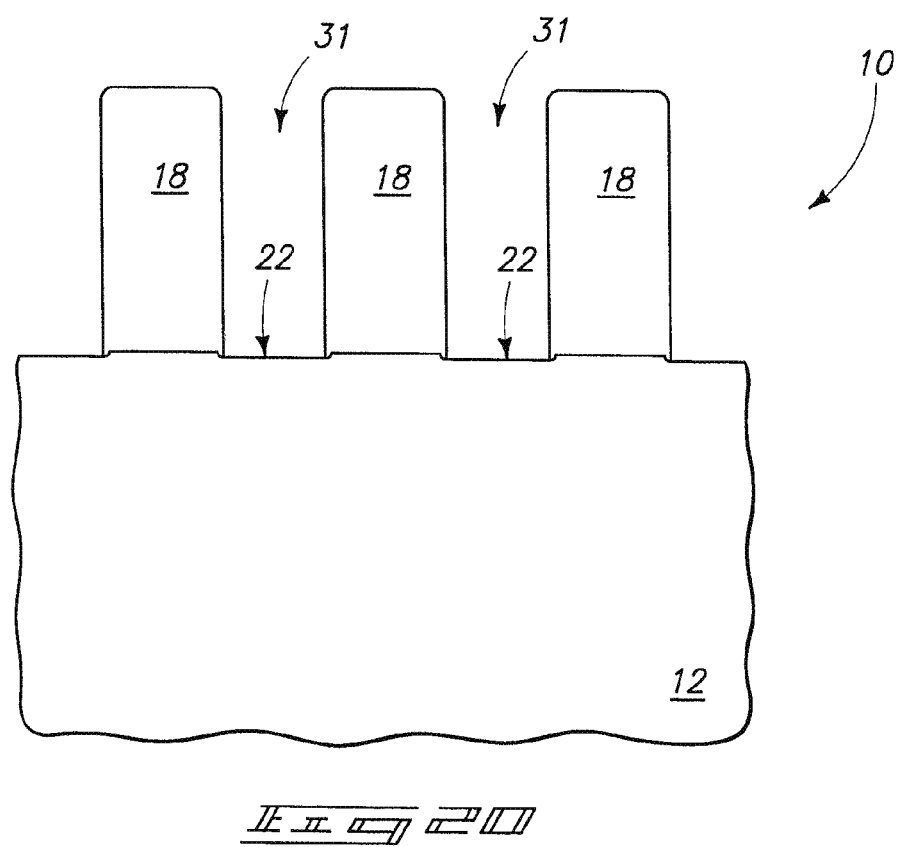
FIG. 20 is a cross-sectional view of the memory device 10 rotated 90° from the embodiment illustrated in FIG. 18.

FIGS. 17-20 are views of the memory device 10 at a processing step subsequent to that of FIGS. 13-16. More particularly, FIGS. 17 and 18 are top and cross-sectional views, respectively, of the memory device 10 and FIGS. 19 and 20 are top and cross-sectional views, respectively, of the memory device 10 rotated 90° from the embodiments illustrated in FIGS. 17 and 18. As illustrated in FIG. 18, for example, a portion of the sacrificial layer 30 is selectively etched to form opening 31 and to expose the nitride liner 28 over upper surface portions 22 of substrate 12. The sacrificial layer 30 is selectively etched so that columns 30 remain extending upward above the STI regions 14. As shown in FIG. 18, the exposed portions of the nitride liner 28 on the upper surface portions 22 are removed to expose the upper surface portions 22 of the silicon substrate 12 between the columns 30. In one embodiment, a selective nitride etch is used to etch the nitride liner 28 from the upper surface portions 22 of the substrate 12. After removing portions of the sacrificial layer 30 and the nitride liner 28 as described above, openings 31 extend to expose the upper surface portions 22. In one embodiment, the exposed upper surface portions 22 function as active areas for the memory device 10.

FIGS. 21-24 are views of the memory device 10 at a processing step subsequent to that of FIGS. 17-20. More particularly, FIGS. 21 and 22 are top and cross-sectional views, respectively, of the memory device 10 and FIGS. 23 and 24 are top and cross-sectional views, respectively, of the memory device 10 rotated 90° from the embodiments illustrated in FIGS. 21 and 22. As illustrated in FIGS. 21-24, insulative spacers 34 have been formed on either side of the sacrificial layer 30 (e.g., FIG. 22) and the nitride runners 18 (e.g., FIG. 24). In one embodiment, the insulative spacers 34 comprise Tetraethyl Orthosilicate (TEOS).

In one embodiment, a layer of insulative material is deposited over the silicon substrate 12 in order to fill the openings 31 (FIG. 18). The insulative material is then anisotropically etched to form the sacrificial insulative spacers 34. For example, in one embodiment, a reactive ion etch is used to remove portions of the insulative material, leaving only about 200 to 500 Angstroms of material surrounding the nitride runners 18 and the sacrificial layer 30. As illustrated in FIGS. 21 and 23, for example, the etching of the insulative material leaves a generally cylindrical openings 32 that expose a smaller surface area of the upper surface portion 22. In one embodiment, the insulative spacers 34 improve the critical dimensions possible for subsequently formed structures that are formed over or upon upper surface portions 22 of the silicon substrate 12.

FIGS. 25-28 are views of the memory device 10 at a processing step subsequent to that of FIGS. 21-24. More particularly, FIGS. 25 and 26 are top and cross-sectional views, respectively, of the memory device 10 and FIGS. 27 and 28 are top and cross-sectional views, respectively, of the memory device 10 rotated 90° from the embodiments illustrated in FIGS. 25 and 26. As illustrated in FIG. 26, for example, an additional nitride material 33 is deposited inside the spacers 34 forming nitride plugs 38 that fill the openings 32 (FIG. 22). Nitride 33 may be formed by depositing a nitride material in the cylindrical openings 32 and then selectively etching (not shown) the nitride material to form nitride plugs 38 inside the sacrificial insulative spacers 34. In one embodiment, the nitride plugs 38 will have a thickness in the range of about 500 to 1200 Angstroms between the spacers 34 after such selective etching (not shown in FIGS. 25-28).

Figure 29:
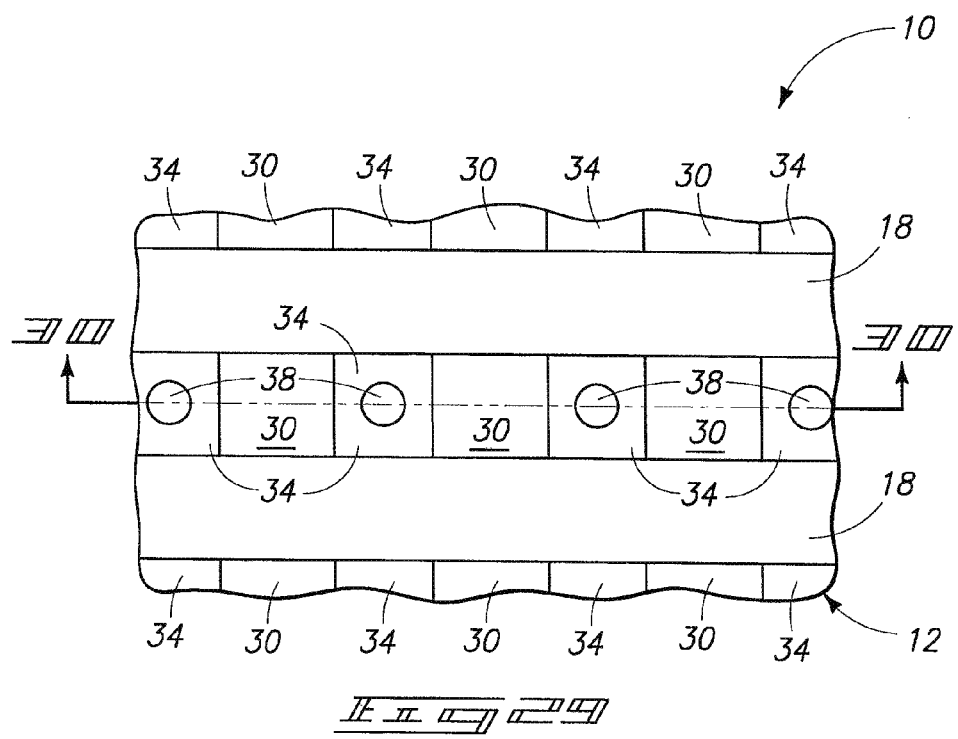
FIG. 29 is a top view of the memory device 10 at a processing stage subsequent to that of FIG. 25.
Figure 30:
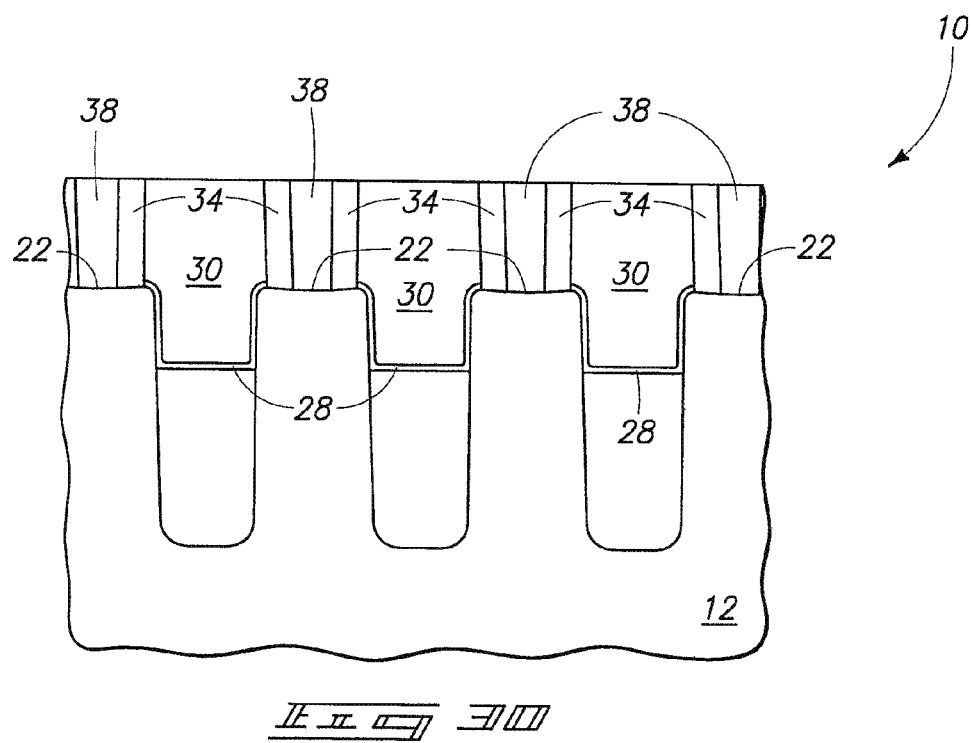
FIG. 30 is a cross-sectional view of the memory device 10 at a processing stage subsequent to that of FIG. 26.

FIGS. 29-32 are views of the memory device 10 at a processing step subsequent to that of FIGS. 25-28. More particularly, FIGS. 29 and 30 are top and cross-sectional views, respectively, of the memory device 10 and FIGS. 31 and 32 are top and cross-sectional views, respectively, of the memory device 10 rotated 90° from the embodiments illustrated in FIGS. 29 and 30.

In the embodiment of FIGS. 29-32, nitride plugs 38 extend upward from the exposed upper surface portions 22 of the silicon substrate 12 in the cylindrical openings. In one embodiment, upper surfaces of the nitride material 33 of plugs 38 (FIG. 28), nitride runners 18, and insulative spacers 34 are removed using a blanket nitride etch or CMP in order to form the separated nitride plugs 38 from formally interconnected material 33 (FIGS. 25-28). In one embodiment, the nitride plugs 38 are elevationally level with, or below, upper surfaces 47 of the nitride runners 18.

Figure 35:
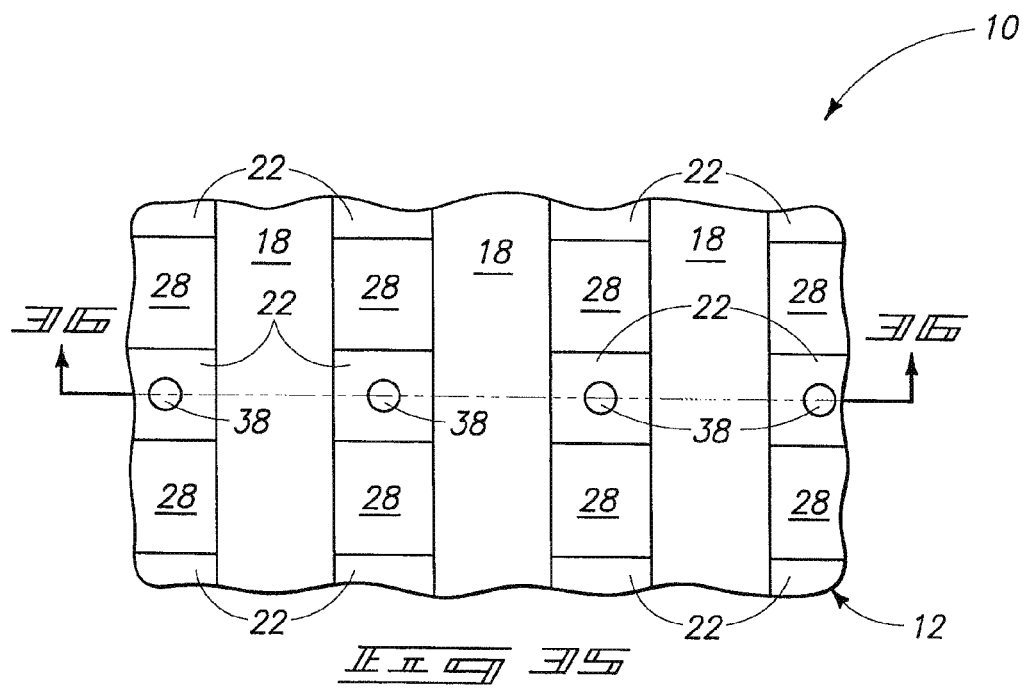
FIG. 35 is a top view of the memory device 10 rotated 90° from the embodiment illustrated in FIG. 33.
Figure 36:
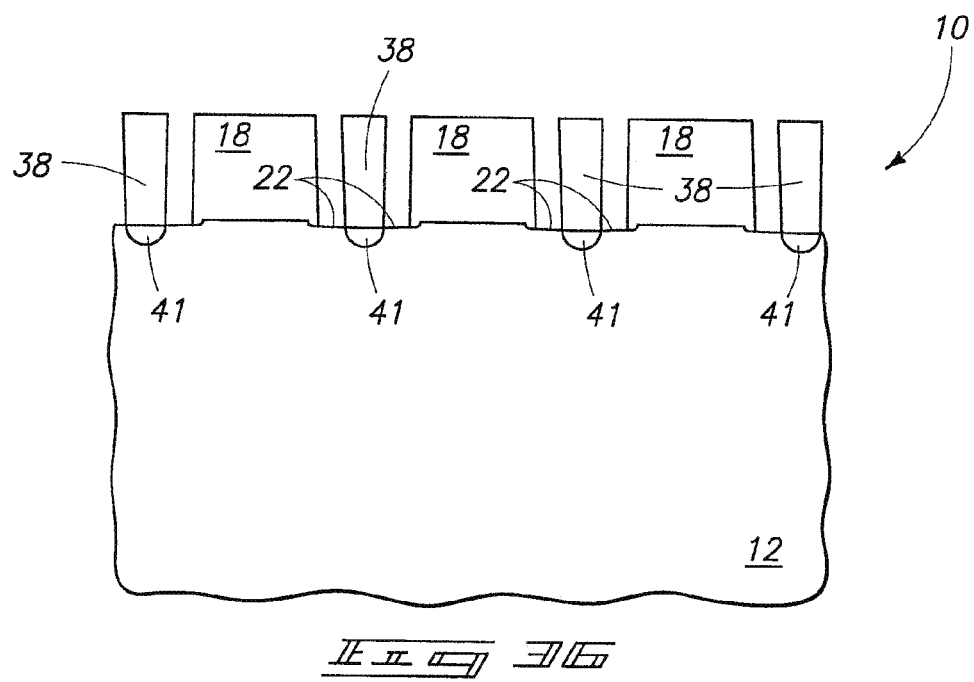
FIG. 36 is a cross-sectional view of the memory device 10 rotated 90° from the embodiment illustrated in FIG. 34.

FIGS. 33-36 are views of the memory device 10 at a processing step subsequent to that of FIGS. 29-32. More particularly, FIGS. 33 and 34 are top and cross-sectional views, respectively, of the memory device 10 and FIGS. 35 and 36 are top and cross-sectional views, respectively, of the memory device 10 rotated 90° from the embodiments illustrated in FIGS. 33 and 34. As illustrated in FIGS. 34 and 36, for example, the sacrificial layers 30 and the insulative spacers 34 (shown in FIG. 30, for example) have been removed. In one embodiment, the sacrificial layer 30 and insulative spacers 34 are entirely removed using an etching process, such as a diluted hydrofluoric acid etch and/or a buffered oxide etch. In other embodiments, other materials may be used to selectively etch the sacrificial layer 30 and the insulative spacers 34. In an advantageous embodiment, the selective etch stops etching at nitride and silicon materials, such as the nitride liner 28, nitride runners 18, and upper surface portions 22 of silicon substrate 12. As shown in FIG. 34, the selective etching forms openings 42 that are defined by nitride liner 28 and nitride runners 18.

Figure 37:
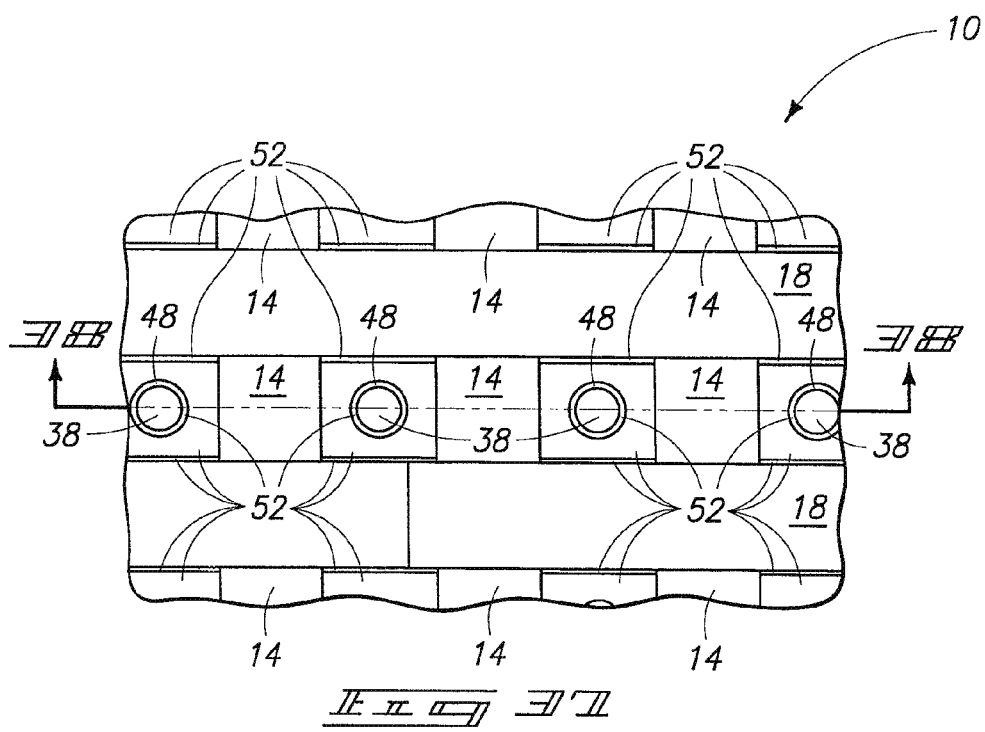
FIG. 37 is a top view of the memory device 10 at a processing stage subsequent to that of FIG. 33.
Figure 38:
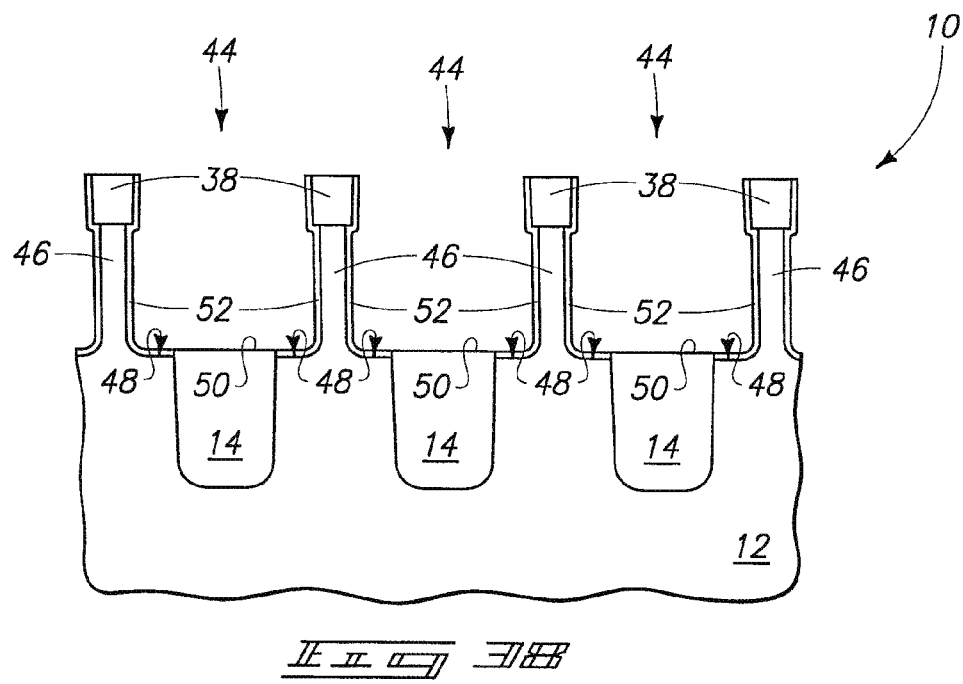
FIG. 38 is a cross-sectional view of the memory device 10 at a processing stage subsequent to that of FIG. 34.
Figure 39:
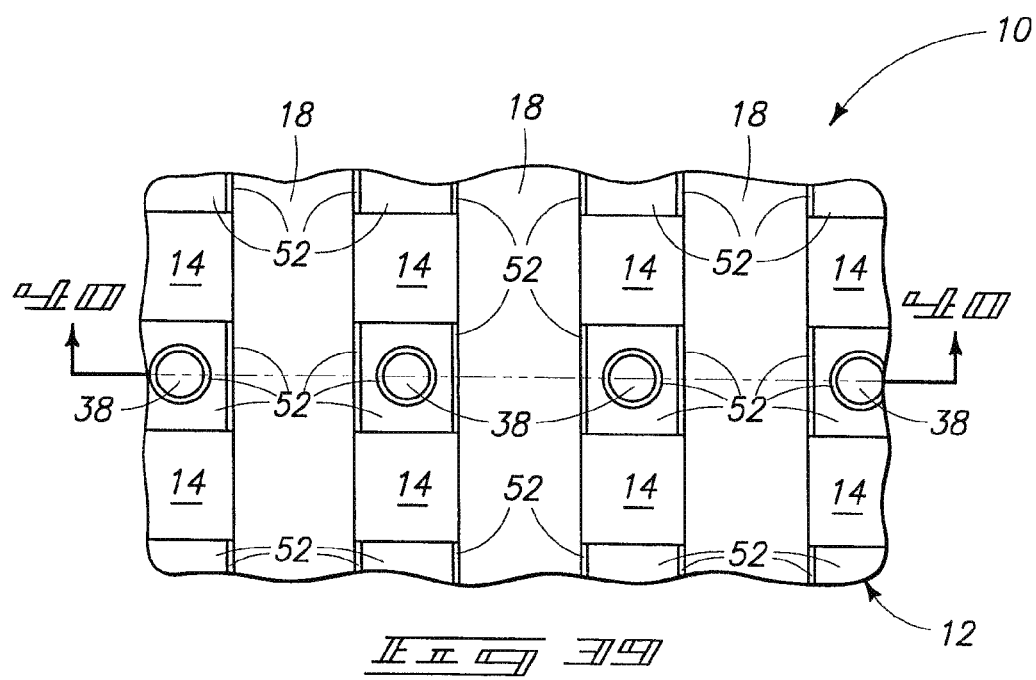
FIG. 39 is a top view of the memory device 10 rotated 90° from the embodiment illustrated in FIG. 37.
Figure 40:
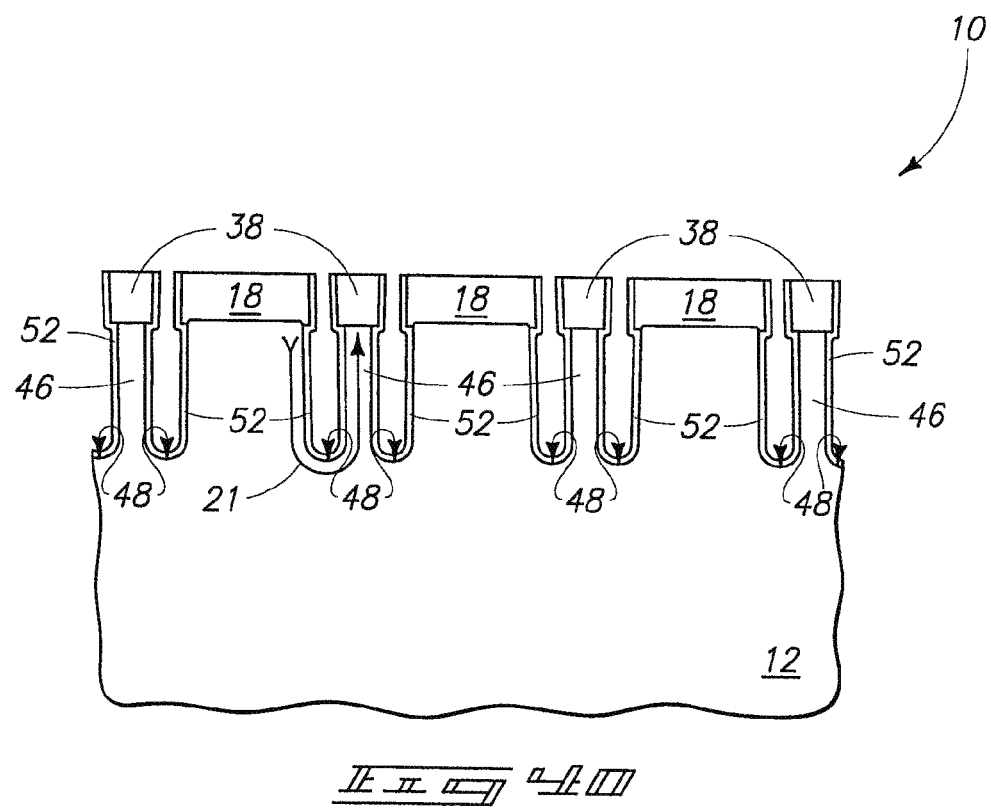
FIG. 40 is a cross-sectional view of the memory device 10 rotated 90° from the embodiment illustrated in FIG. 38.

FIGS. 37-40 are views of the memory device 10 at a processing step subsequent to that of FIGS. 33-36. More particularly, FIGS. 37 and 38 are top and cross-sectional views, respectively, of the memory device 10 and FIGS. 39 and 40 are top and cross-sectional views, respectively, of the memory device 10 rotated 90° from the embodiments illustrated in FIGS. 37 and 38. At the processing stage illustrated in FIGS. 37-40, at least a portion of the nitride liner 28, the upper surface portions 22 of substrate 12, and the STI region 14 are removed using one or more etching processes. In one embodiment, portions of the nitride plugs 38 are also etched when the nitride liner 28, and substrate 12, and STI region 14 are etched as described above. Accordingly, in this embodiment, the height of the nitride plugs 38 is decreased due to this etching. After this etching is complete, an insulative film 52 is deposited on the exposed surfaces of the silicon substrate 12. After completion of these processing steps, which are discussed in further detail below, a channel 21 is created in the silicon substrate 12, wherein a length of the channel is determined by the depth of the etching.

In one embodiment, a dry/wet nitride punch etch, using, for example, $H_3PO_4$ solution, has been used to remove the nitride liner 28 (FIG. 34) from over the STI region 14, the sidewall of silicon substrate 12 and the upper surface portions 22 of silicon substrate 12.

In one embodiment, a selective dry etch is used to remove portions of the upper surface portions 22 adjacent the nitride plugs 38. The selective dry etch may also remove portions of the STI region 14, while leaving portions of the silicon substrate 12 directly below the nitride plugs 38. The portions of the silicon substrate 12 that remain below the nitride plugs 38 are hereinafter referred to as silicon support structures 46. In one embodiment, the support structures 46 are generally annular or cylindrical shaped, similar to the nitride plugs 38 which extend above the silicon support structures 46. As illustrated in FIG. 38, for example, the selective etching enlarges openings 42 (FIG. 34) to form enlarged openings 44. The enlarged openings 44 are defined by the silicon support structures 46, an upper surface 48 of the silicon substrate 12, and an upper surface 50 of the STI regions 14. In one embodiment, the etching process will remove slightly more of the silicon substrate 12 than the STI region 14. In this embodiment, the upper surface 48 of the silicon substrate 12 is slightly below the upper surface 50 of the STI regions 14.

After forming the enlarged openings 44, an insulative film 52 is grown over the exposed portions of the silicon substrate 12 and the silicon support structures 46. In one embodiment, the insulative film 52 comprises an oxide, such as silicon dioxide. Referring to FIG. 38, for example, the insulative film 52 can be seen covering the side walls of the nitride plugs 38 and the silicon support structures 46, as well as the upper surface 48 of the silicon substrate 12. In some embodiments, the insulative film serves as a gate oxide dielectric for transistors. An exemplary method of forming the dielectric may include CVD deposition of a low K material on the exposed silicon surfaces of the upper surface 48 of the silicon substrate 12, the silicon support structures 46, and the side walls of the nitride plugs 38.

In one embodiment, the silicon support structures 46 serve as a portion of a channel for transistors of the memory device 10. Accordingly, the length of the silicon support structures 46 defines a vertical length of the transistor channel 21. In the embodiments illustrated in FIGS. 37-40, because the transistor channel 21 extends perpendicularly to the orientation of substrate 12, the transistor channel 21 defines a channel of a vertical transistor.

Figure 41:
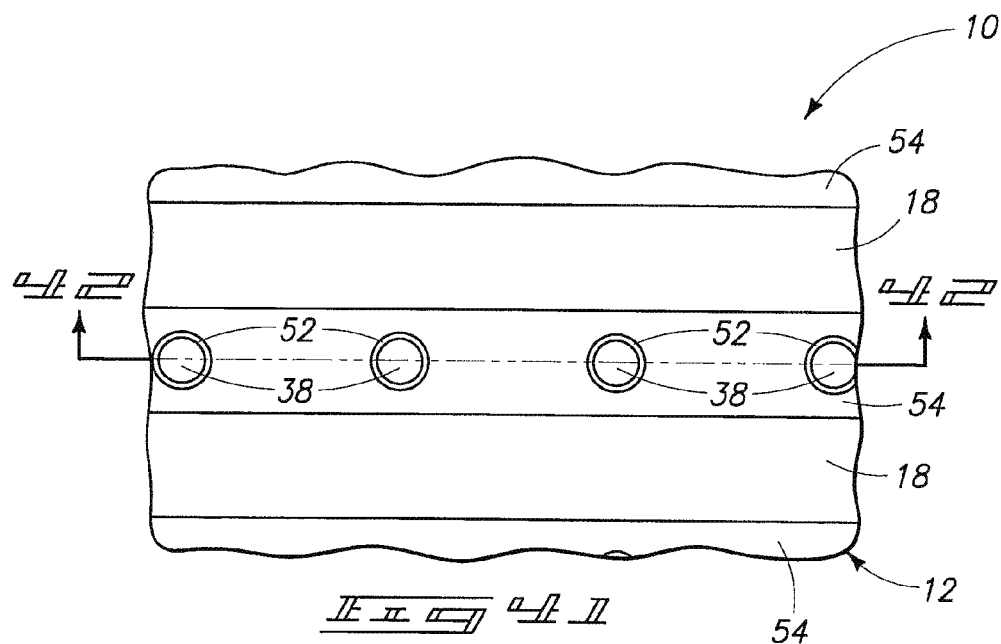
FIG. 41 is a top view of the memory device 10 at a processing stage subsequent to that of FIG. 37.
Figure 42:
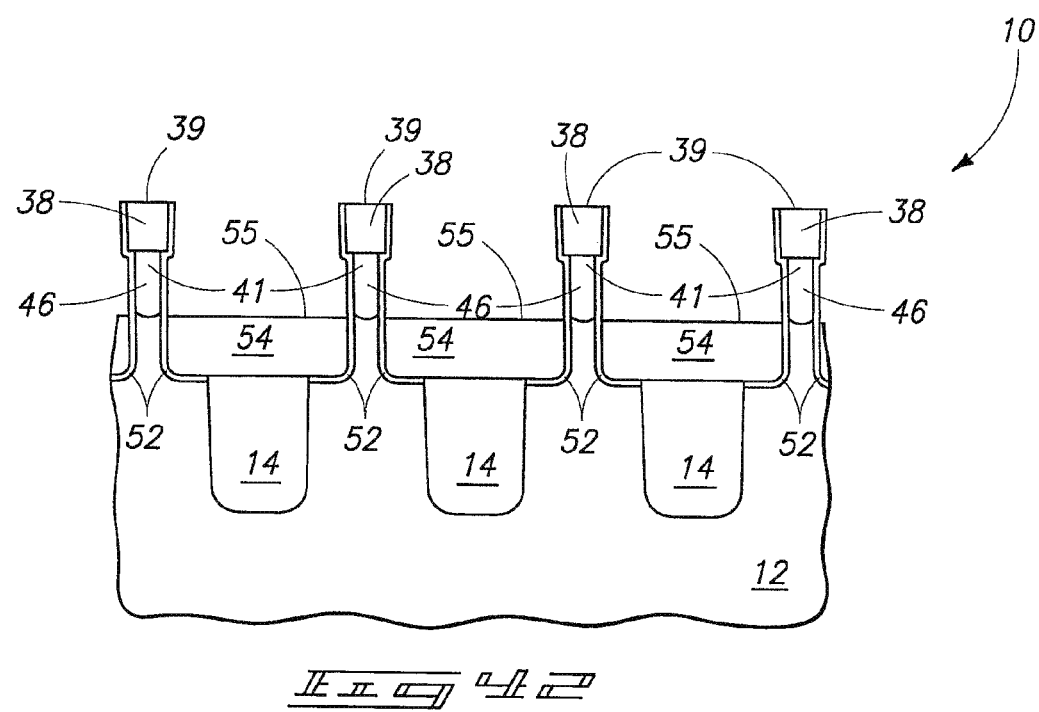
FIG. 42 is a cross-sectional view of the memory device 10 at a processing stage subsequent to that of FIG. 38.
Figure 43:
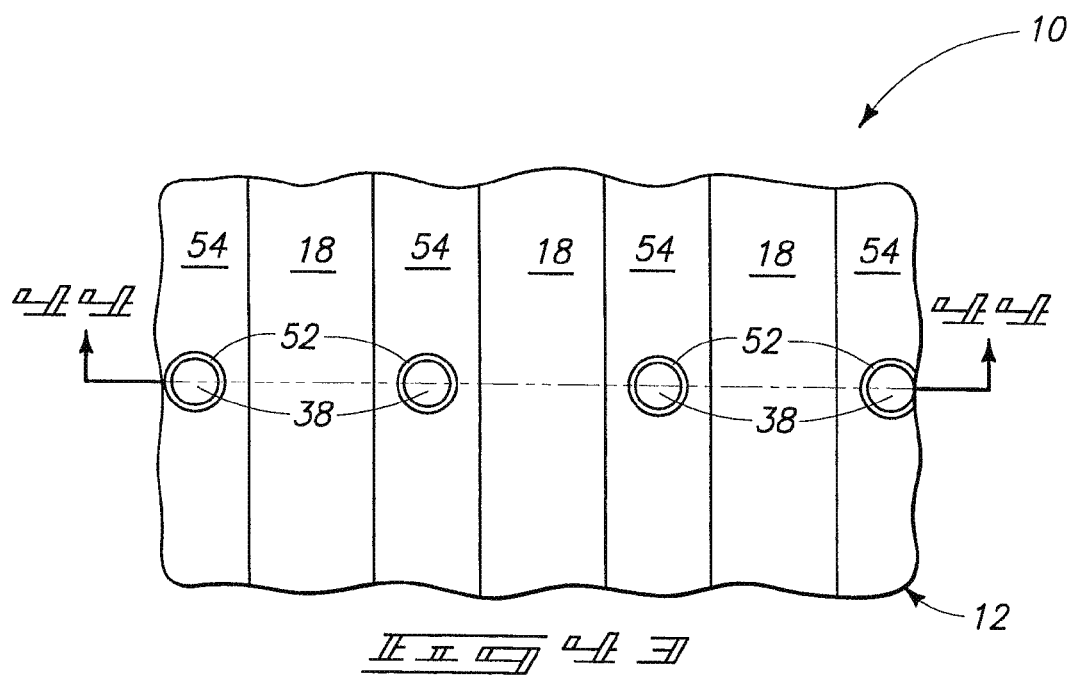
FIG. 43 is a top view of the memory device 10 rotated 90° from the embodiment illustrated in FIG. 41.
Figure 44:
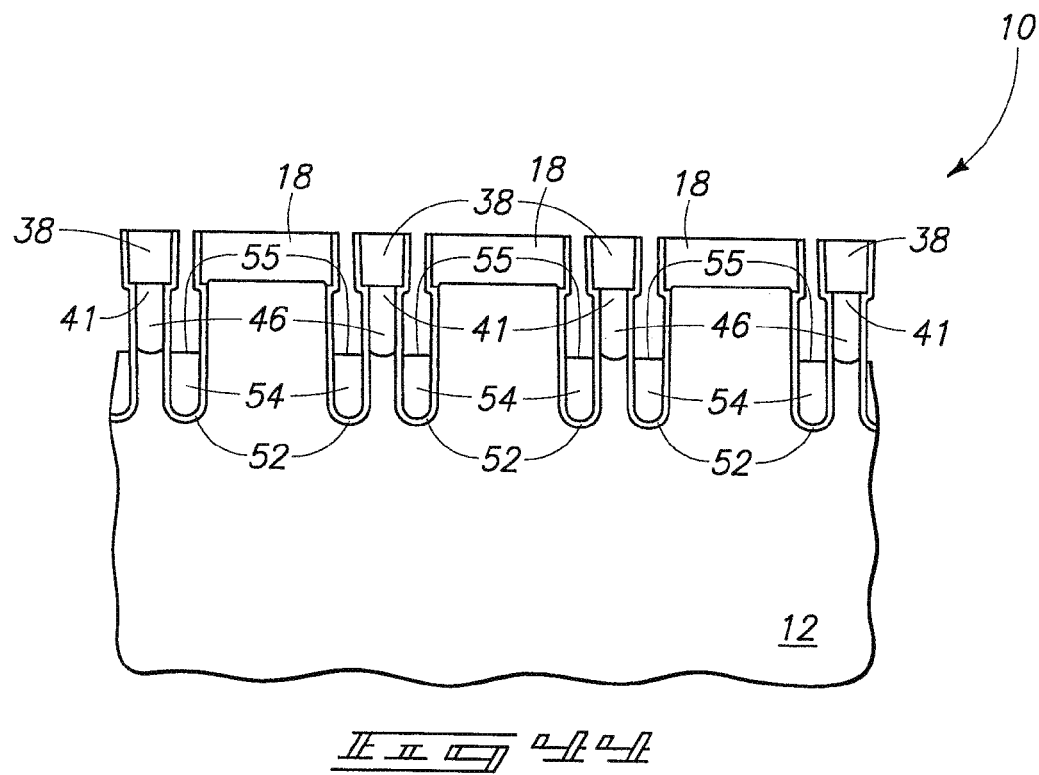
FIG. 44 is a cross-sectional view of the memory device 10 rotated 90° from the embodiment illustrated in FIG. 42.

FIGS. 41-44 are views of the memory device 10 at a processing step subsequent to that of FIGS. 37-40. More particularly, FIGS. 41 and 42 are top and cross-sectional views, respectively, of the memory device 10 and FIGS. 43 and 44 are top and cross-sectional views, respectively, of the memory device 10 rotated 90° from the embodiments illustrated in FIGS. 41 and 42. At the stage of processing illustrated in FIGS. 41-44, diffusion regions 41 have been formed below the nitride plugs 38 and transistor gates 54 have been formed over the insulative film 52. In one embodiment, the transistor gates 54 comprise word lines of the memory device 10, such as a DRAM.

In one embodiment, an implant method may be used to transfer a conductivity dopant through the nitride plugs 38 to the silicon substrate 12 directly beneath the nitride plugs 38. In another embodiment, an angle implant method may be used to form the diffusion regions 41. For example, Arsenic or Phosphorous may be implanted in the substrate 12, below the nitride plugs 38, angled from within the openings 44 (FIG. 38). Those of skill in the art will recognize that various alternative methods and doping materials may be used in forming the diffusions regions 41. Any suitable doping method may be used to create the diffusion regions 41. In one embodiment, the diffusion regions 41 are configured to serve as source/drain regions of a transistor device. More generally, the diffusion regions 41 may be used as electrical contacts between charge storage devices, such as capacitors, and other components of a transistor and/or a memory device.

In one embodiment, a conductive material 54, such as polysilicon, is deposited on the insulative film 52 and the STI region 14. In some embodiments, portions of the deposited conductive material may be removed by a polishing process, such as CMP, to an elevation below the silicon nitride plugs 38. For example, FIG. 42 illustrates the upper surfaces 55 of the transistor gate 54 about 1000 Angstroms below the upper surfaces 39 of the silicon nitride plugs 38.

In an advantageous embodiment, the transistor gates 54 are recessed from the silicon substrate so that the gate regions are spaced further from the source/drain regions of the transistor devices in the memory 10. In the embodiment of FIG. 42, for example, the transistor gates 54 are recessed below an upper surface of the substrate 12. In other embodiments, the transistor gates 54 are recessed about 500 Angstroms, or in the range of about 250 to 1,000 Angstroms, below an upper surface of the substrate 12. Accordingly, cross capacitance between the gate regions and the source/drain regions may be reduced, thus improving the accuracy of the memory device.

Figure 47:
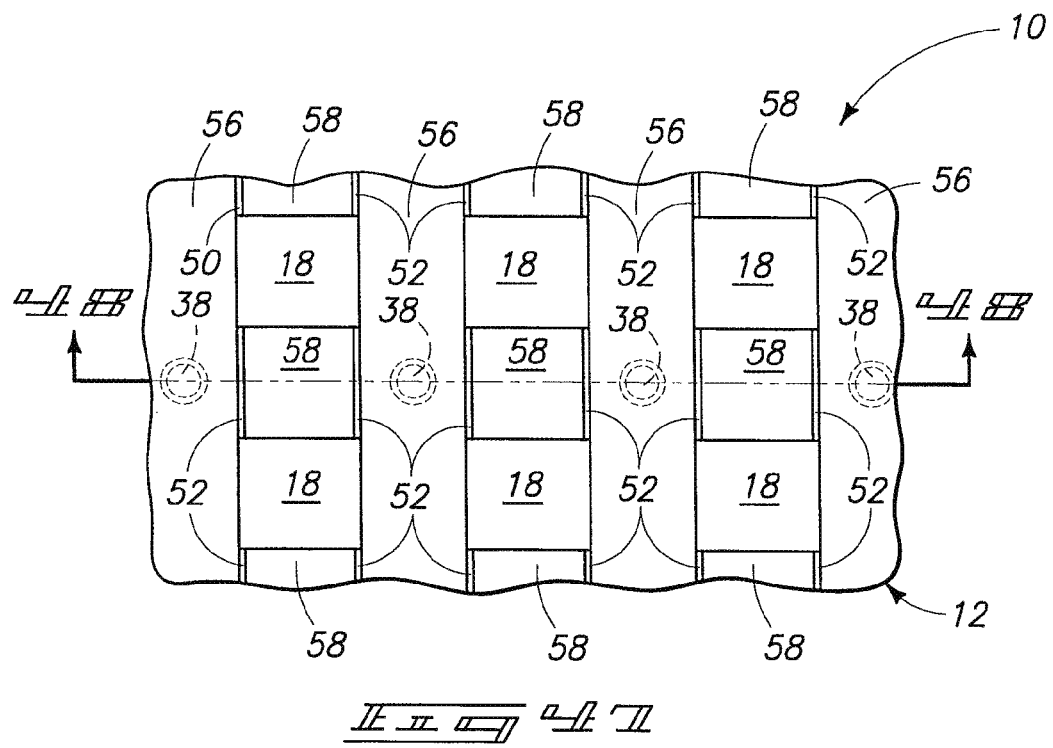
FIG. 47 is a top view of the memory device 10 rotated 90° from the embodiment illustrated in FIG. 45.
Figure 48:
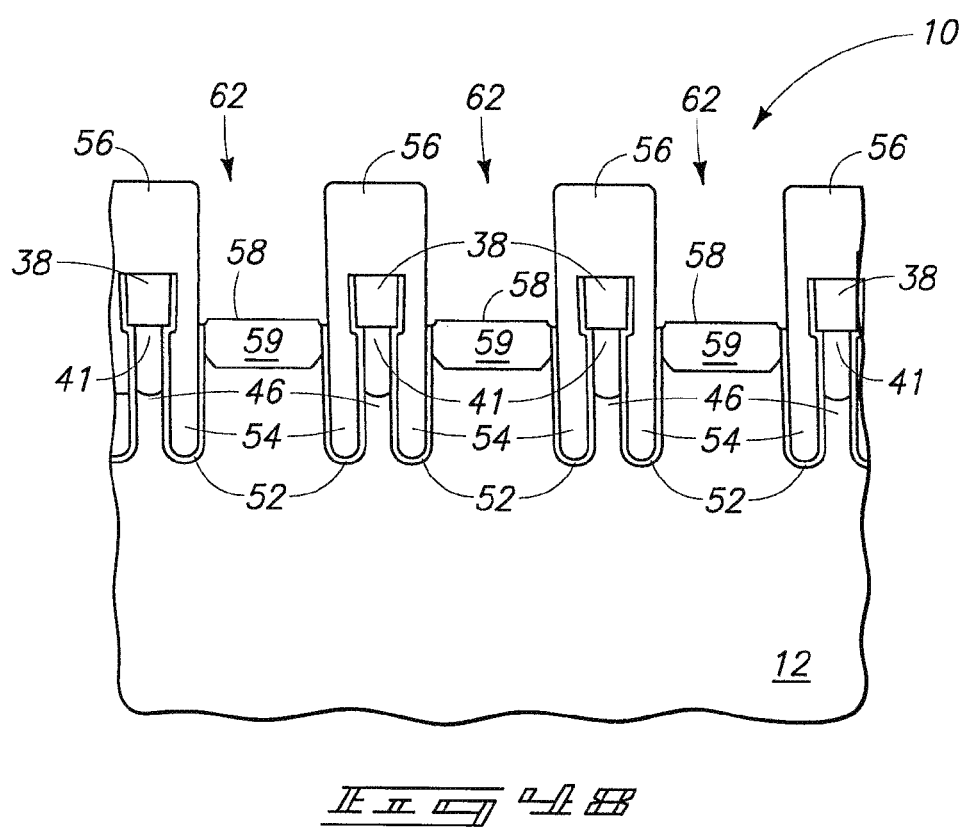
FIG. 48 is a cross-sectional view of the memory device 10 rotated 90° from the embodiment illustrated in FIG. 46.

FIGS. 45-48 are views of the memory device 10 at a processing step subsequent to that of FIGS. 40-44. More particularly, FIGS. 45 and 46 are top and cross-sectional views, respectively, of the memory device 10 and FIGS. 47 and 48 are top and cross-sectional views, respectively, of the memory device 10 rotated 90° from the embodiments illustrated in FIGS. 45 and 46. At the processing stage illustrated in FIGS. 45-48, an insulative material 56 has been deposited atop the transistor gates 54 (FIGS. 45 and 46, for example). In addition, a conductivity dopant is implanted into the exposed surfaces of the silicon substrate 12 in order to form diffusion regions 59, which may be transistor sources or drains (FIGS. 47 and 48, for example).

In one embodiment, the insulative material 56 comprises spin-on-glass (SOG) and TEOS layers. Outermost portions of the insulative layer 56 may be removed by CMP or other planar etching methods to expose nitride runners 18. Next, the nitride runners 18 are patterned and selectively etched to form opening 62 that extend through portions of the nitride runners 18 down to upper surface portions 58 of substrate 12.

As illustrated in FIG. 48, for example, a conductivity implant is performed to provide a conductivity dopant into upper surface portions 58 of substrate 12 in order to form active areas 59. In one embodiment, the active areas 59 comprise source/drain regions of devices such as, for example, transistors.

Figure 49:
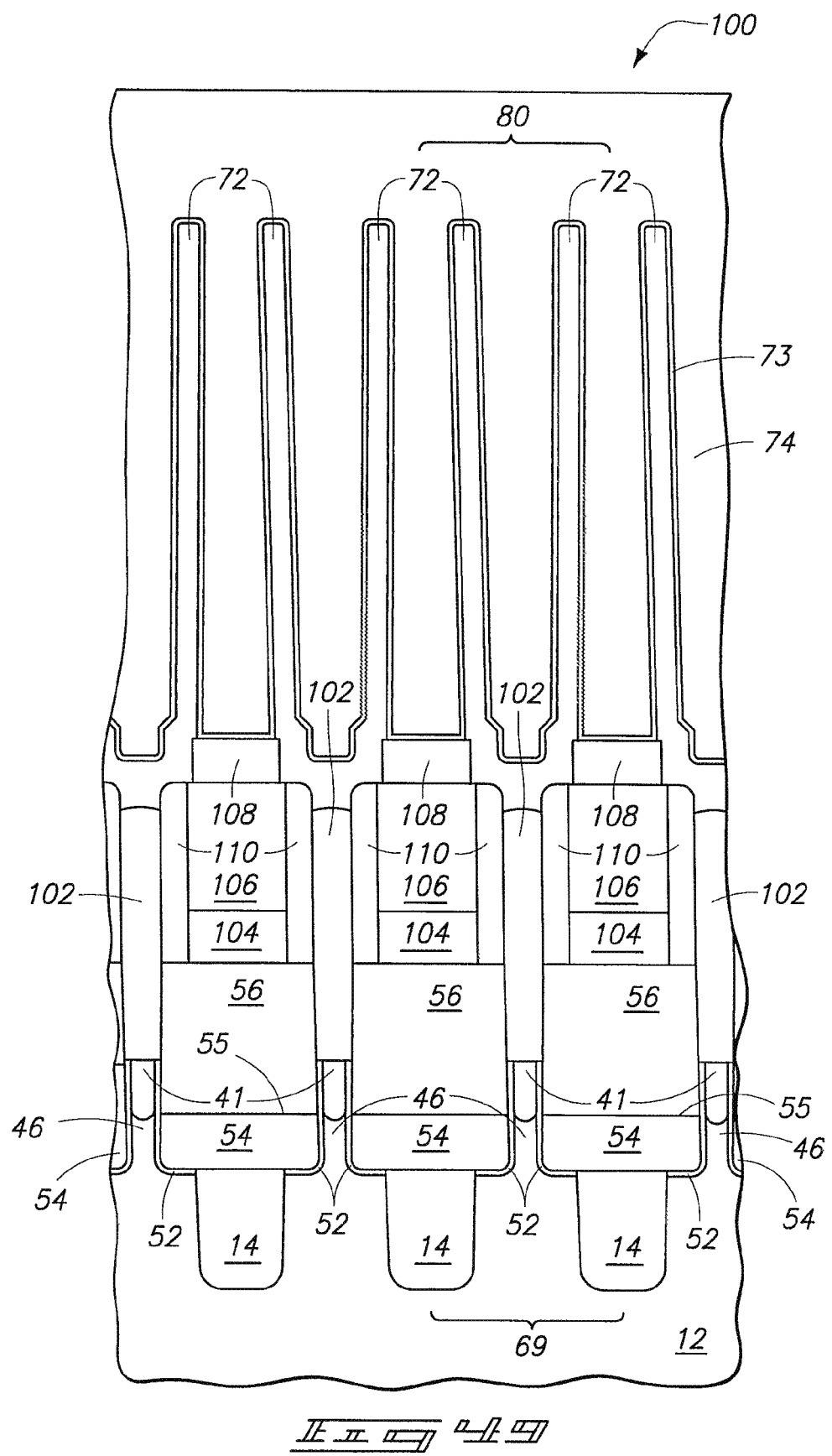
FIG. 49 is a cross-sectional view of the memory device 10 (at the same orientation as FIG. 46) at a subsequent processing stage.

FIGS. 49 and 50 are views of the memory device 10 at a processing step subsequent to that of FIGS. 45-48. More particularly, FIGS. 49 and 50 are cross-sectional views, respectively, of the memory device 10, where FIG. 49 is at the same orientation as FIG. 46 and FIG. 50 is at the same orientation as FIG. 48. FIGS. 49 and 50 illustrate transistors electrically coupled to charge storage devices. For example, exemplary transistor 69 is electrically coupled to exemplary capacitor 80 (FIG. 50). The transistor 69 and capacitor 80 combine to form an exemplary memory cell 103.

Those of skill in the art will recognize that a FET transistor typically comprises a gate, a gate dielectric, a source and drain, and a channel. In the embodiment of FIGS. 49 and 50, the transistor 69 comprises gate 54, gate dielectric 52, source/drain regions 41 and 59, and channel 21. FIG. 50 illustrates arrows in the channel 21 which indicate current flow between the source/drain region 59 and the source/drain region 41. Thus, in one embodiment, activation of the transistor 69 establishes a conductivity channel 21 from source/drain region 59 to source/drain region 41. In one embodiment, the source/drain region 59 comprises a transistor source and the source/drain region 41 comprises a transistor drain. In one embodiment, the source/drain region 59 comprises a transistor drain and the source/drain region 41 comprises a transistor source.

Several process steps may be performed in order to transform the partially complete memory device 10 illustrated in FIGS. 45-48 to the memory device 100 illustrated in FIGS. 49 and 50. Initially, at least portions of the insulative material 56, the silicon support structures 46, and the nitride plugs 38 are removed in order to expose the source/drain regions 41. Conductive material, such as polysilicon, for example, may then be deposited, forming an electrical contact 102 that couples with the capacitor 80, for example. In the embodiment of FIGS. 49 and 50, the transistor 69 includes intermediate structures that insulate portions of the transistor 69 from the capacitor 80. For example, the transistor 69 comprises a nitride cap 106 and insulative spacers 110 that are formed over the digit line 104. In one embodiment, a silicon dioxide layer 108 may also be deposited on the nitride caps 106. In one embodiment, the capacitor 80 comprises a capacitor dielectric 73 over a storage node 72 and a top cell plate 74 over the capacitor dielectric 73.

In the embodiment of FIGS. 49 and 50, a dielectric plug 63 is deposited above the transistor gates 54 and the active areas 59. In one embodiment, the dielectric plug 63 comprises an oxide material, such as silicon dioxide, for example. The dielectric plug 63 may then be patterned and etched to form contact holes that expose middle portions of the active areas 59. Metal stacks comprising polysilicon and/or silicide layers, for example, may then be deposited in the contact holes in order to form digit lines 104. Thus, the dielectric plug 63 moves the digit line 104 conductor away from the silicon support structures 46. Advantageously, the digit lines 104 directly contact the active areas 59 so that a conductive plug is not necessary to electrically couple the digit lines 104 with the active areas 59. Such conductive plugs are commonly formed in prior art transistors using epitaxial processes. By removing the need for an additional epitaxial process, the manufacturing defect rate may be decreased.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A method of fabricating a memory device, the method comprising;
   forming a recessed gate within semiconductive material;
   forming a first source/drain region and a second source/drain region adjacent opposing lateral sides of the recessed gate, wherein application of a voltage to the gate results in the formation of a conductive channel between the first and second source/drain regions along a path that is within the semiconductive material;
   forming a charge storage device above the semiconductive material, wherein the charge storage device is electrically coupled to the first source/drain region; and
   forming a conductive data line which electrically and directly physically contacts the second source/drain region in the absence of any separately formed conductive plug extending between the second source/drain region and the conductive data line in a completed construction of the memory device.

2. The method of claim 1 comprising forming the first and second source/drain regions to have coplanar upper surfaces in the completed construction of the memory device.

3. The method of claim 1 comprising forming the charge storage device to comprise a capacitor.

4. The method of claim 3 comprising forming the capacitor to comprise:
   a storage node;
   a dielectric substantially surrounding the storage node; and
   a top cell plate substantially surrounding the dielectric.

5. The method of claim 1 comprising forming an upper surface of the gate to be elevationally below upper surfaces of each of the first and second source/drain regions.

6. The method of claim 5 comprising forming the upper surface of the gate to be elevationally closer to a lower surface of the second source/drain region than to the second source/drain region upper surface in the completed construction of the memory device.

7. The method of claim 1 comprising forming an upper surface of the gate to be elevationally closer to lower surfaces of each of the first and second source/drain regions than to an upper surface of the semiconductive material in the completed construction of the memory device.

8. The method of claim 2 comprising forming a gate dielectric in contact with the recessed gate and to extend along the lateral sides, and forming the gate dielectric to have an uppermost surface which is co-planar with the upper surfaces of each of the first and second source/drain regions in the completed construction of the memory device.

9. A method of fabricating a memory device, the method comprising;
   forming a recessed gate within semiconductive material;
   forming a first source/drain region and a second source/drain region adjacent opposing lateral sides of the recessed gate, wherein application of a voltage to the gate results in the formation of a conductive channel between the first and second source/drain regions along a path that is within the semiconductive material;
   forming a charge storage device above the semiconductive material, wherein the charge storage device is electrically coupled to the first source/drain region;
   forming a conductive data line electrically coupled to the second source/drain region; and
   forming the first and second source/drain regions to have coplanar upper surfaces in a completed construction of the memory device.

10. A method of fabricating a memory device, the method comprising;
    forming a recessed gate within semiconductive material;
    forming a first source/drain region and a second source/drain region adjacent opposing lateral sides of the recessed gate, wherein application of a voltage to the gate results in the formation of a conductive channel between the first and second source/drain regions along a path that is within the semiconductive material;
    forming a charge storage device above the semiconductive material, wherein the charge storage device is electrically coupled to the first source/drain region;

forming a conductive data line electrically coupled to the second source/drain region;

forming an upper surface of the gate to be elevationally below upper surfaces of each of the first and second source/drain regions; and forming the upper surface of the gate to be elevationally closer to a lower surface of the second source/drain region than to the second source/drain region upper surface in a completed construction of the memory device.

11. A method of fabricating a memory device, the method comprising;

forming a recessed gate within semiconductive material;

forming a first source/drain region and a second source/drain region adjacent opposing lateral sides of the recessed gate, wherein application of a voltage to the gate results in the formation of a conductive channel between the first and second source/drain regions along a path that is within the semiconductive material;

forming a charge storage device above the semiconductive material, wherein the charge storage device is electrically coupled to the first source/drain region;

forming a conductive data line electrically coupled to the second source/drain region; and forming an upper surface of the gate to be elevationally closer to lower surfaces of each of the first and second source/drain regions than to an upper surface of the semiconductive material in a completed construction of the memory device.

12. A method of fabricating a memory device, the method comprising;

forming a recessed gate within semiconductive material;

forming a first source/drain region and a second source/drain region adjacent opposing lateral sides of the recessed gate, wherein application of a voltage to the gate results in the formation of a conductive channel between the first and second source/drain regions along a path that is within the semiconductive material;

forming a charge storage device above the semiconductive material, wherein the charge storage device is electrically coupled to the first source/drain region;

forming a conductive data line electrically coupled to the second source/drain region;

forming a gate dielectric in contact with the recessed gate and to extend along the lateral sides; and forming the gate dielectric to have an uppermost surface which is co-planar with upper surfaces of each of the first and second source/drain regions in a completed construction of the memory device.

* * * * *